(12) United States Patent
Hamasaki et al.

(10) Patent No.: US 12,290,000 B2
(45) Date of Patent: Apr. 29, 2025

(54) ACOUSTIC WAVE DEVICE AND COMMUNICATION MODULE

(71) Applicant: TAIYO YUDEN CO., LTD., Tokyo (JP)

(72) Inventors: Jyunichi Hamasaki, Tokyo (JP); Kazushige Hatakeyama, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 869 days.

(21) Appl. No.: 17/500,495

(22) Filed: Oct. 13, 2021

(65) Prior Publication Data
US 2022/0140224 A1    May 5, 2022

(30) Foreign Application Priority Data
Oct. 29, 2020    (JP) ................. 2020-181579

(51) Int. Cl.
| H01L 41/047 | (2006.01) |
| H01L 25/04 | (2023.01) |
| H10N 30/87 | (2023.01) |
| H10N 30/88 | (2023.01) |

(52) U.S. Cl.
CPC ........... H10N 30/875 (2023.02); H01L 25/04 (2013.01); H10N 30/883 (2023.02)

(58) Field of Classification Search
CPC ............. H10N 30/883; H03H 9/02535; H03H 9/02574; H03H 9/058
USPC ...... 310/313 R, 313 A, 313 B, 313 C, 313 D
See application file for complete search history.

(56) References Cited

U.S. PATENT DOCUMENTS

| 8,610,518 B1 | 12/2013 | Solal et al. ............. 333/193 |
| 8,836,449 B2 | 9/2014 | Pang et al. ............. 333/187 |
| 2009/0224851 A1* | 9/2009 | Feiertag ............. H03H 9/059 |
| | | 361/728 |
| 2017/0179920 A1 | 6/2017 | Kawasaki |

(Continued)

FOREIGN PATENT DOCUMENTS

| JP | 2006-211613 A | 8/2006 |
| JP | 2008-546207 A | 12/2008 |
| JP | 4760222 B2 | 6/2011 |

(Continued)

OTHER PUBLICATIONS

Notice of Reasons for Refusal issued on Jun. 4, 2024, in a counterpart Japanese Patent Application No. 2020-181579.

*Primary Examiner* — Derek J Rosenau
(74) *Attorney, Agent, or Firm* — Stein IP, LLC

(57) ABSTRACT

An acoustic wave device includes a first substrate having first and second surfaces opposite from each other, and side surfaces connecting the first and second surfaces, a first acoustic wave element disposed on the first surface of the first substrate, a second substrate that is provided over the first surface of the first substrate and over the first acoustic wave element and has a first air gap between the second and first substrates, a second acoustic wave element disposed on the second substrate, a ground terminal disposed on the second surface of the first substrate, a first metal layer provided between the first and second acoustic wave elements and located in the first air gap, and a second metal layer that covers half or more of a total area of the side surfaces of the first substrate and electrically connects the first metal layer and the ground terminal.

12 Claims, 17 Drawing Sheets

(56) References Cited

U.S. PATENT DOCUMENTS

2017/0272051 A1   9/2017   Kurihara et al.

FOREIGN PATENT DOCUMENTS

| | | |
|---|---|---|
| JP | 2014-230079 A | 12/2014 |
| JP | 2017-118273 A | 6/2017 |
| JP | 2017-169139 A | 9/2017 |

* cited by examiner

ACOUSTIC WAVE DEVICE AND COMMUNICATION MODULE

CROSS-REFERENCE TO RELATED APPLICATION

This application is based upon and claims the benefit of priority of the prior Japanese Patent Application No. 2020-181579, filed on Oct. 29, 2020, the entire contents of which are incorporated herein by reference.

FIELD

A certain aspect of the present embodiments relates to an acoustic wave device and a communication module.

BACKGROUND

It is known to obtain the electromagnetic shielding effect by providing a metal layer connected to a ground to an opposite surface of an acoustic wave device from the surface having an acoustic wave element formed thereon, as disclosed in Japanese Patent Application Publication No. 2006-211613. In addition, it is known to mount a first substrate having a first acoustic wave element formed thereon over a second substrate having a second acoustic wave element formed thereon to miniaturize the acoustic wave device. In this case, it is known to provide a metal layer connected to a ground between the first acoustic wave element and the second acoustic wave element for electromagnetic shielding as disclosed in Japanese Patent Application Publication Nos. 2008-546207 and 2017-118273.

SUMMARY

However, simply providing the metal layer connected to the ground between the first acoustic wave element and the second acoustic wave element may be insufficient to provide electromagnetic shielding effect, which may result in deterioration in characteristics.

According to a first aspect of the present disclosure, there is provided an acoustic wave device including: a first substrate having a first surface, a second surface opposite from the first surface, and side surfaces connecting the first surface and the second surface; a first acoustic wave element disposed on the first surface of the first substrate; a second substrate that is provided over the first surface of the first substrate and over the first acoustic wave element and has a first air gap between the second substrate and the first substrate; a second acoustic wave element disposed on the second substrate; a ground terminal disposed on the second surface of the first substrate; a first metal layer provided between the first acoustic wave element and the second acoustic wave element and located in the first air gap; and a second metal layer that covers half or more of a total area of the side surfaces of the first substrate and electrically connects the first metal layer and the ground terminal.

According to a second aspect of the present disclosure, there is provided a communication module including: a circuit substrate; and the above acoustic wave device mounted on the circuit substrate.

DETAILED DESCRIPTION

Hereinafter, with reference to the accompanying drawings, embodiments of the present disclosure will be described.

First Embodiment

Figure 1:
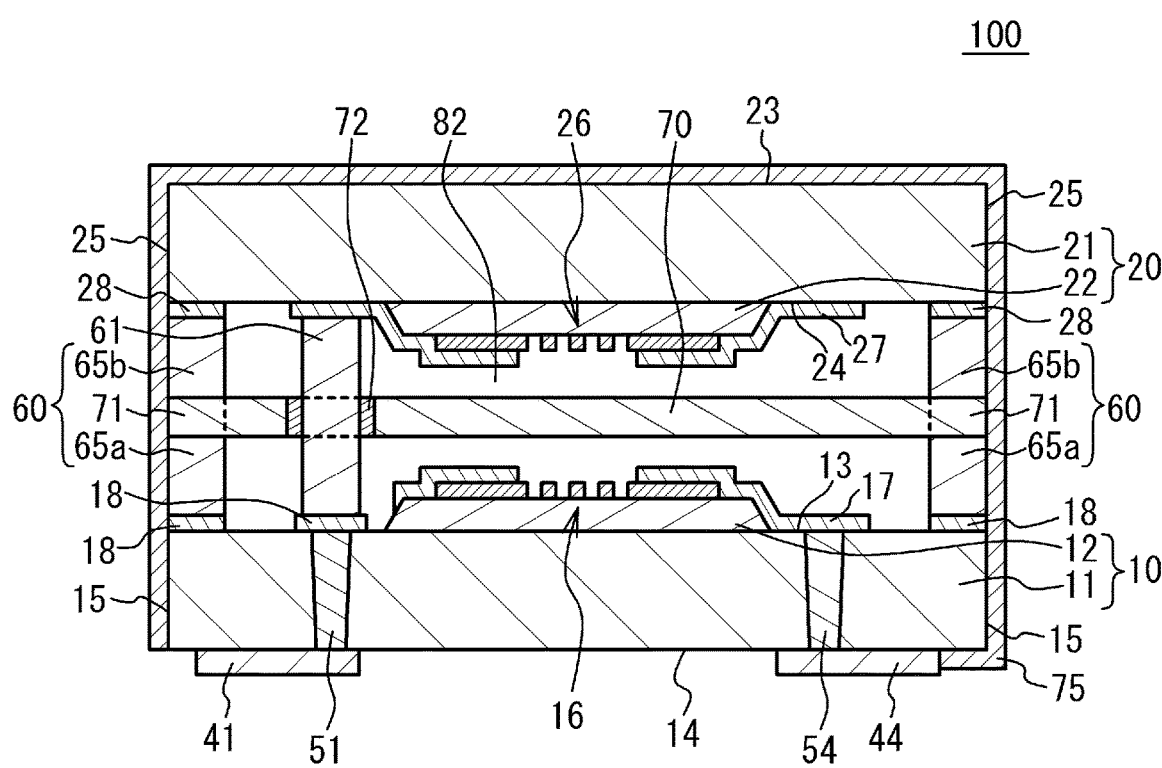
FIG. 1 is a cross-sectional view of an acoustic wave device in accordance with a first embodiment.

FIG. 1 is a cross-sectional view of an acoustic wave device in accordance with a first embodiment. As illustrated in FIG. 1, in an acoustic wave device 100 of the first embodiment, a substrate 20 having acoustic wave elements 26 disposed thereon is mounted over a substrate 10 having acoustic wave elements 16 disposed thereon. The substrate 10 is formed of an insulating member, and includes a support substrate 11 and a piezoelectric layer 12. Similarly, the substrate 20 is formed of an insulating member, and includes a support substrate 21 and a piezoelectric layer 22.

The support substrates 11 and 21 are, for example, sapphire substrates, alumina substrates, spinel substrates, quartz substrates, crystal substrates, silicon substrates, zirconium oxides substrate, or resin substrates, and have thicknesses of approximately 50 µm to 150 µm. The sapphire substrate is a substrate mainly composed of monocrystalline $Al_2O_3$. The alumina substrate is a substrate mainly composed of polycrystalline $Al_2O_3$. The spinel substrate is a substrate mainly composed of monocrystalline or polycrystalline $MgAl_2O_4$. The quartz substrate is a substrate mainly composed of amorphous $SiO_2$. The crystal substrate is a substrate mainly composed of monocrystalline $SiO_2$.

The piezoelectric layers 12 and 22 are, for example, monocrystalline lithium tantalate layers or monocrystalline lithium niobate layers, and have thicknesses of approximately 10 µm to 30 µm. The linear expansion coefficient of the support substrate 11 is preferably less than the linear expansion coefficient of the piezoelectric layer 12, and the linear expansion coefficient of the support substrate 21 is preferably less than the linear expansion coefficient of the piezoelectric layer 22. This configuration can reduce the frequency temperature dependence. The substrate 10 is not limited to the substrate in which the piezoelectric layer 12 is provided on the support substrate 11, and may be a single plate made of lithium tantalate or lithium niobate. Similarly, the substrate 20 is not limited to the substrate in which the piezoelectric layer 22 is provided on the support substrate 21, and may be a single plate made of lithium tantalate or lithium niobate.

An insulating film having acoustic impedance different from those of the support substrate and the piezoelectric layer may be provided between the support substrate 11 and the piezoelectric layer 12 and/or between the support substrate 21 and the piezoelectric layer 22 to improve the acoustic characteristics of the acoustic wave element. As described above, the piezoelectric layer 12 is directly or indirectly bonded to the surface of the support substrate 11, and the piezoelectric layer 22 is directly or indirectly bonded to the surface of the support substrate 21. The insulating film having acoustic impedance different from those of the support substrate and the piezoelectric layer may have a temperature coefficient of an elastic constant opposite in sign to the temperature coefficient of the elastic constant of the piezoelectric layer, and may be, for example, an additive-free silicon oxide layer or a silicon oxide layer containing additive elements such as fluorine. This configuration can reduce the temperature coefficient of frequency. The insulating film having acoustic impedance different from those of the support substrate and the piezoelectric layer may be, for example, polycrystalline or amorphous, and may be, for example, an aluminum oxide layer, a silicon layer, an aluminum nitride layer, a silicon nitride layer, or a silicon carbide layer.

The acoustic wave elements 16 are disposed on an upper surface 13 of the substrate 10. The acoustic wave elements 26 are disposed on a lower surface 24 of the substrate 20. The upper surface 13 of the substrate 10 is uneven due to the piezoelectric layer 12. Similarly, the lower surface 24 of the substrate 20 is uneven due to the piezoelectric layer 22. The upper surface 13 of the substrate 10 is opposite to the lower surface 24 of the substrate 20 across an air gap 82 (a first air gap). Thus, the acoustic wave elements 16 and the acoustic wave elements 26 are opposite to each other in the air gap 82 between the substrate 10 and the substrate 20.

Figure 2:
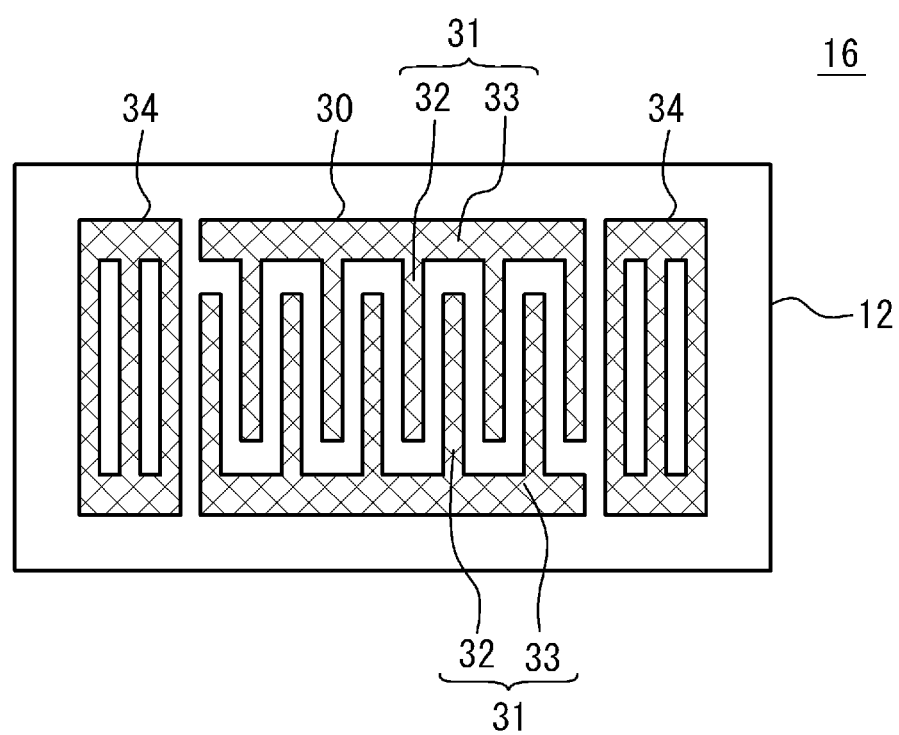
FIG. 2 is a plan view of the acoustic wave element in the first embodiment.

FIG. 2 is a plan view of the acoustic wave element in the first embodiment. FIG. 2 illustrates the acoustic wave element 16 as an example, but the same applies to the acoustic wave element 26. As illustrated in FIG. 2, the acoustic wave element 16 is, for example, a surface acoustic wave resonator, and includes an interdigital transducer (IDT) 30 and reflectors 34 on the piezoelectric layer 12. The IDT 30 includes a pair of comb-shaped electrodes 31 opposite to each other. The comb-shaped electrode 31 includes electrode fingers 32, and a bus bar 33 to which the electrode fingers 32 are coupled. The reflectors 34 are located at both sides of the IDT 30. The IDT 30 excites a surface acoustic wave on the piezoelectric layer 12. The reflectors 34 reflect the surface acoustic wave. The IDT 30 and the reflectors 34 are formed of a metal film such as, but not limited to, an aluminum film or a copper film.

In the acoustic wave device 100 of the first embodiment, the acoustic wave elements 16 disposed on the piezoelectric layer 12 form a transmit filter, and the acoustic wave elements 26 disposed on the piezoelectric layer 22 form a receive filter. This will be described later.

As illustrated in FIG. 1, wiring lines 17 electrically connected to the acoustic wave elements 16 are provided on the upper surface 13 of the substrate 10. Wiring lines 27 electrically connected to the acoustic wave elements 26 are provided on the lower surface 24 of the substrate 20. The wiring lines 17 and 27 are metal layers including, for example, copper layers, aluminum layers, or gold layers. Terminals, which are foot pads for connecting the acoustic wave device 100 to an external device, are provided on a lower surface 14 opposite from the upper surface 13 of the substrate 10. The terminals include a receive terminal 41 and a ground terminal 44. The terminal is a metal layer including a copper layer, an aluminum layer, a gold layer, or the like, and has a thickness of approximately several micrometers.

The acoustic wave elements 16 disposed on the upper surface 13 of the substrate 10 are electrically connected to the ground terminal 44 through the wiring lines 17 and a via wiring 54 provided in the substrate 10. The acoustic wave elements 26 disposed on the lower surface 24 of the substrate 20 are electrically connected to the receive terminal 41 through the wiring lines 27, a pillar 61 provided between the substrate 10 and the substrate 20, and a via wiring 51 provided in the substrate 10. The pillar 61 is bonded to a metal layer 18 provided on the upper surface 13 of the substrate 10 and the wiring line 27 provided on the lower surface 24 of the substrate 20 by solder.

A ring-shaped metal layer 60 surrounding the acoustic wave elements 16 and the acoustic wave elements 26 is provided between the substrate 10 and the substrate 20. Additionally, a shield metal layer 70 is provided between the substrate 10 and the substrate 20 and located in the air gap 82 between the acoustic wave elements 16 and the acoustic wave elements 26. The ring-shaped metal layer 60 includes a part 71 of the shield metal layer 70 and post portions 65a and 65b sandwiching the part 71 therebetween. The post portion 65a is bonded to the metal layer 18 provided on the upper surface 13 of the substrate 10 by solder, and the post portion 65b is bonded to a metal layer 28 provided on the lower surface 24 of the substrate 20 by solder. The shield metal layer 70 preferably extends across the entire region where the acoustic wave elements 16 and the acoustic wave elements 26 are provided and is located between the acoustic wave elements 16 and the acoustic wave elements 26. However, the shield metal layer 70 may extend across ⅔ or more of the region where the acoustic wave elements 16 and the acoustic wave elements 26 are provided, or may extend across ¾ or more of the region where the acoustic wave elements 16 and the acoustic wave elements 26 are provided.

The acoustic wave elements 16 and the acoustic wave elements 26 are sealed in the air gap 82 between the substrate 10 and the substrate 20 by the ring-shaped metal layer 60. The shield metal layer 70 is in contact with the ring-shaped metal layer 60 and is electrically connected to the ring-shaped metal layer 60. The shield metal layer 70 has an aperture, and the pillar 61 passes through the aperture. An insulating resin film 72 is embedded between the pillar 61 and the shield metal layer 70. This configuration electrically insulates the pillar 61 and the shield metal layer 70 from each other. When the shield metal layer 70 and the pillar 61 can be sufficiently distanced from each other, the resin film 72 may be omitted, and the shield metal layer 70 and the pillar 61 may be insulated from each other across the air gap. In this case, the air gap 82 between the substrate 10 and the shield metal layer 70 is communicated with the air gap 82 between the substrate 20 and the shield metal layer 70.

The post portions 65a and 65b are formed of metal layers including, for example, nickel layers, copper layers, or gold layers, and have heights of approximately 10 μm to 30 μm. The shield metal layer 70 is a metal layer including a conductive metal layer such as, but not limited to, a copper layer, a gold layer, a silver layer, a tungsten layer, an aluminum layer, or a titanium layer, or a magnetic metal layer such as, but not limited to, an iron layer, a nickel layer, or an iron-nickel alloy layer (such as a kovar layer). The thickness of the shield metal layer 70 is preferably equal to or greater than the skin depth of the electromagnetic wave to be shielded, and is, for example, approximately 1 μm to 40 μm.

Figure 3A:
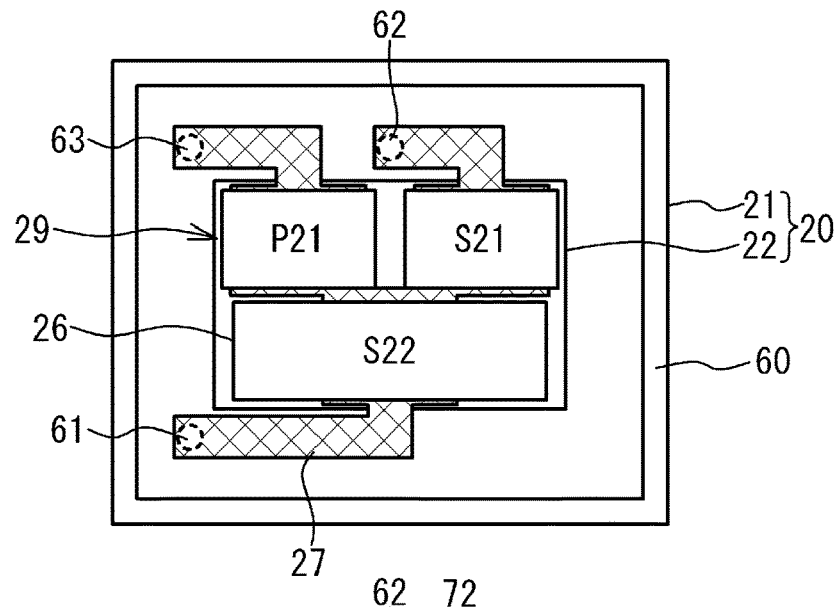
FIG. 3A and FIG. 3C are plan views of a substrate in the first embodiment.
Figure 3B:
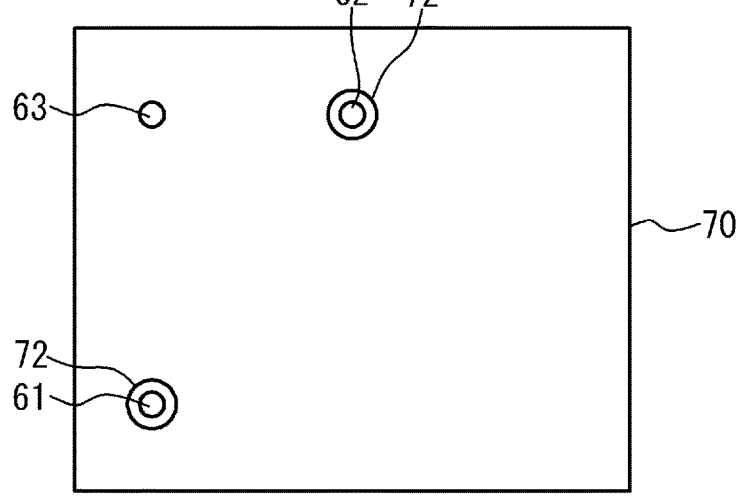
FIG. 3B is a plan view of a shield metal layer.
Figure 3C:
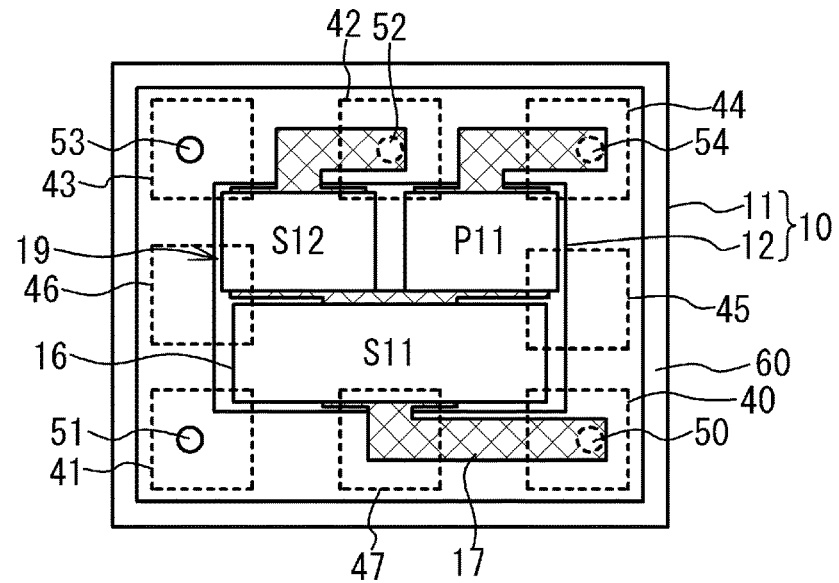

FIG. 3A and FIG. 3C are plan views of the substrate in the first embodiment, and FIG. 3B is a plan view of the shield metal layer. FIG. 3A is a plan view of the substrate 20, and is a transparent plan view as viewed from above the substrate 20 to clarify correspondence with FIG. 3B and FIG. 3C. FIG. 3C is a plan view of the substrate 10, and indicates the terminals disposed on the lower surface 14 of the substrate 10 by dotted lines. In addition, for clarity of the drawings, pillars 61 to 63 are not illustrated in FIG. 3C.

As illustrated in FIG. 3A, the acoustic wave elements 26, the wiring lines 27, and the pillars 61 to 63 are disposed on the substrate 20 (on the lower surface 24 in FIG. 1). The acoustic wave elements 26 include series resonators S21 and S22 and a parallel resonator P21. The pillars 61 to 63 are connected to the wiring lines 27. The ring-shaped metal layer 60 surrounds the series resonators S21 and S22, the parallel resonator P21, and the wiring lines 27. The pillars 61 to 63 are metal layers including, for example, copper layers, gold layers, silver layers, tungsten layers, aluminum layers, titanium layers, iron layers, nickel layers, or iron-nickel alloy layers, and have heights approximately equal to that of the ring-shaped metal layer 60.

As illustrated in FIG. 3B, the insulating resin film 72 is provided between the shield metal layer 70 and the pillar 61 and between the shield metal layer 70 and the pillar 62, and the pillars 61 and 62 are electrically insulated from the shield metal layer 70. The pillar 63 is in contact with the shield metal layer 70 and is electrically connected to the shield metal layer 70. The shield metal layer 70 is provided across the entire region where the substrate 10 and the substrate 20 are opposite to each other in a plan view.

As illustrated in FIG. 3C, the acoustic wave elements 16, the wiring lines 17, and the ring-shaped metal layer 60 are provided on the substrate 10. The acoustic wave elements 16 include series resonators S11 and S12 and a parallel resonator P11. Via wirings 50 to 54 are provided in the substrate 10. The via wiring 50, the via wiring 52, and the via wiring 54 are coupled to the wiring lines 17. The via wiring 51 is coupled to the pillar 61, the via wiring 52 is coupled to the pillar 62, and the via wiring 53 is coupled to the pillar 63. The ring-shaped metal layer 60 surrounds the series resonators S11 and S12, the parallel resonator P11, and the wiring line 17. The via wirings 50 to 54 are metal layers including, for example, copper layers, aluminum layers, or gold layers.

The via wiring 50 is coupled to a transmit terminal 40, the via wiring 52 is coupled to a common terminal 42, and the via wiring 54 is coupled to the ground terminal 44. Thus, the series resonators S11 and S12 are connected in series between the transmit terminal 40 and the common terminal 42. The parallel resonator P11 is connected in parallel between the transmit terminal 40 and the common terminal 42. The parallel resonator P11 is connected between the wiring lines 17, which is between the series resonator S11 and the series resonator S12, and the ground terminal 44. As seen from the above, a transmit filter 19, which is a ladder-type filter, is provided to the substrate 10.

The via wiring 51 is coupled to the receive terminal 41, the via wiring 52 is coupled to the common terminal 42, and the via wiring 53 is coupled to a ground terminal 43. Thus, the series resonators S21 and S22 disposed on the substrate 20 are connected in series between the common terminal 42 and the receive terminal 41. The parallel resonator P21 is connected in parallel between the common terminal 42 and the receive terminal 41. The parallel resonator P21 is connected between the wiring line 27, which is between the series resonator S21 and the series resonator S22, and the ground terminal 43. As seen from the above, a receive filter 29, which is a ladder-type filter, is provided to the substrate 20.

The transmit filter 19 transmits signals in the transmit band, as transmission signals, to the common terminal 42 among high-frequency signals input from the transmit terminal 40, and suppresses signals with other frequencies. The receive filter 29 transmits signals in the receive band, as reception signals, to the receive terminal 41 among high-frequency signals input from the common terminal 42, and suppresses signals with other frequencies. As seen from the above, the acoustic wave device 100 is a duplexer. In addition, ground terminals 45 to 47 are also disposed on the lower surface 14 of the substrate 10.

As illustrated in FIG. 1, a covering metal layer 75 is provided to cover half or more of the total area of side surfaces 15 of the substrate 10. The side surfaces 15 are surfaces connecting the upper surface 13 and the lower surface 14. The upper surface 13 and the lower surface 14 of the substrate 10 have substantially rectangular shapes in a plan view, and the substrate 10 has four side surfaces 15. The covering metal layer 75 extends from the side surfaces 15 of the substrate 10 to the ring-shaped metal layer 60, and covers at least a part of the surface of the ring-shaped metal layer 60. In the first embodiment, the covering metal layer 75 covers the entire surfaces of all side surfaces 15 of the substrate 10, the entire outer surface of the ring-shaped metal layer 60, the entire surfaces of all side surfaces 25 of the substrate 20, and an entire upper surface 23 of the substrate 20. The upper surface 23 of the substrate 20 is the surface opposite from the lower surface 24, and the side surface 25 is a surface connecting the upper surface 23 and the lower surface 24. The substrate 20 has four side surfaces 25.

The covering metal layer 75 is a single-layer film or multilayered film made of a highly conducting metal such as, but not limited to, silver, copper, gold, or aluminum. The shield metal layer 70 may be formed of a non-magnetic material such as, but not limited to, titanium, or may be formed of a magnetic material such as, but not limited to, iron or nickel. The covering metal layer 75 has a thickness of, for example, approximately 1 μm to 5 μm. The thickness of the covering metal layer 75 is preferably equal to or greater than the skin depth of the electromagnetic wave to be shielded to allow the covering metal layer 75 to have electromagnetic shielding effect.

Figure 4A:
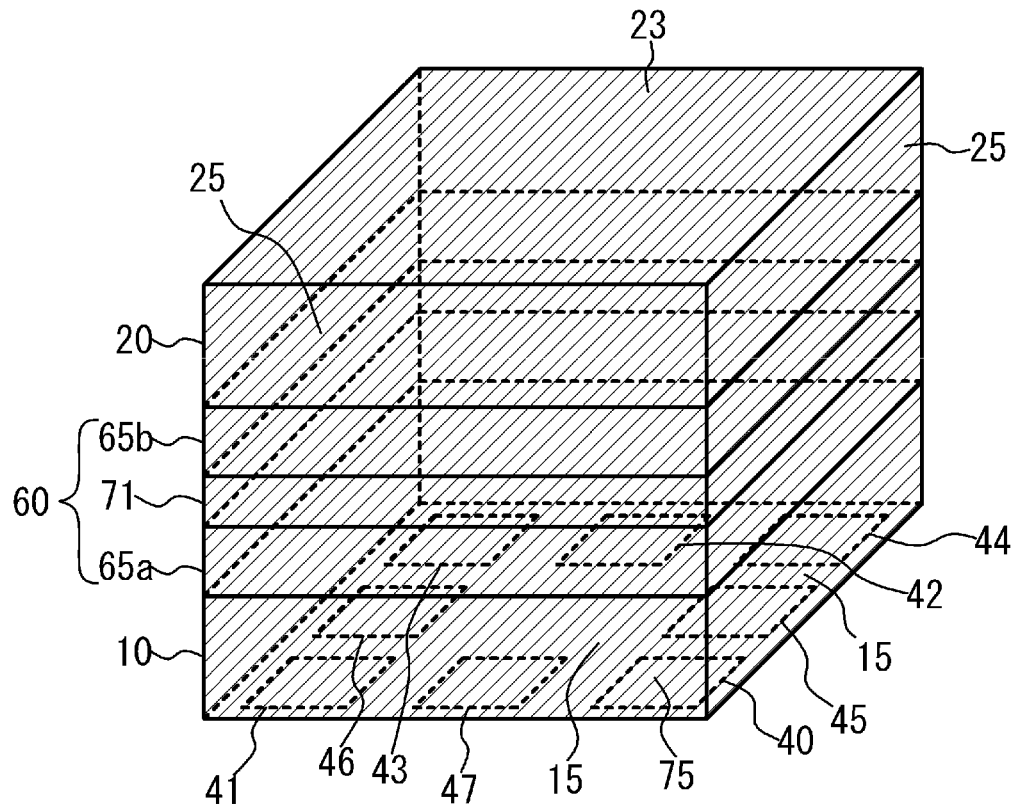
FIG. 4A is a perspective view of the acoustic wave device, illustrating a covered region with a covering metal layer in the first embodiment.
Figure 4B:
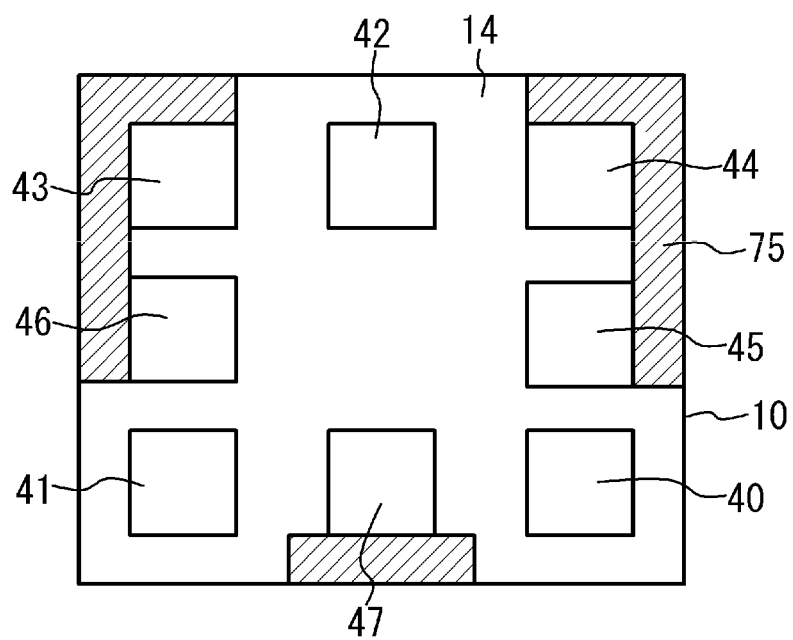
FIG. 4B is a plan view illustrating the lower surface of the substrate.

FIG. 4A is a perspective view of the acoustic wave device illustrating the covered region with the covering metal layer in the first embodiment, and FIG. 4B is a plan view illustrating the lower surface of the substrate. In FIG. 4A and FIG. 4B, for clarity of the drawings, the region where the covering metal layer 75 is provided is indicated by hatching. FIG. 4B is a transparent plan view of the lower surface 14 as viewed from above the substrate 10. As illustrated in FIG. 4A, in the first embodiment, the covering metal layer 75 covers the entire surfaces of all side surfaces 15 of the substrate 10, the entire outer surface of the ring-shaped metal layer 60, the entire surfaces of all side surfaces 25 of the substrate 20, and the entire upper surface 23 of the substrate 20. As illustrated in FIG. 4B, the covering metal layer 75 extends from the side surfaces 15 of the substrate 10 to the lower surface 14, and is in contact with the ground terminals 43 to 47. Therefore, the shield metal layer 70 is electrically connected to a ground through the covering metal layer 75.

Manufacturing Method

Figure 5A:
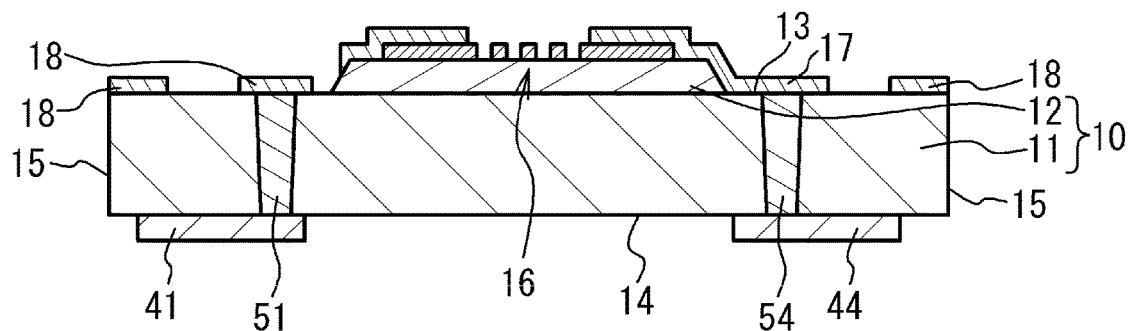
FIG. 5A to FIG. 5D are cross-sectional views (No. 1) illustrating a method of manufacturing the acoustic wave device in accordance with the first embodiment.

FIG. 5A to FIG. 6B are cross-sectional views illustrating a method of manufacturing the acoustic wave device in accordance with the first embodiment. The acoustic wave devices are simultaneously manufactured in a wafer state. However, for clarity of the drawings, one acoustic wave device will be illustrated in FIG. 5A to FIG. 6A. As illustrated in FIG. 5A, after via holes are formed in the support substrate 11, the via wirings 50 to 54 (only the via wirings 51 and 54 are illustrated in FIG. 5A) are formed in the via holes. The via hole is formed by, for example, laser beam irradiation or etching. The via wirings 50 to 54 are formed by, for example, electrolytic plating. Thereafter, after a piezoelectric substrate is bonded to the surface of the support substrate 11, the piezoelectric substrate is thinned by polishing or grinding to form the piezoelectric layer 12. The support substrate 11 and the piezoelectric substrate are bonded to each other using, for example, a direct bonding method in which the surface of the support substrate 11 and the surface of the piezoelectric substrate are activated and bonded at room temperature. The support substrate 11 and the piezoelectric layer 12 form the substrate 10.

Then, the terminals 40 to 47 (only the terminals 41 and 44 are illustrated in FIG. 5A) are formed on the lower surface 14 of the substrate 10. The piezoelectric layer 12 is etched to be patterned. The acoustic wave element 16 is formed on the piezoelectric layer 12. The wiring lines 17 electrically connected to the acoustic wave elements 16 are formed. The metal layer 18 is formed in the region to which the ring-shaped metal layer 60 and the pillars 61 to 63 are bonded. The acoustic wave elements 16, the wiring lines 17, the metal layer 18, and the terminals 40 to 47 are formed using a commonly known method. Through the above steps, the substrate 10 having the acoustic wave elements 16 and the like is formed.

Figure 5B:
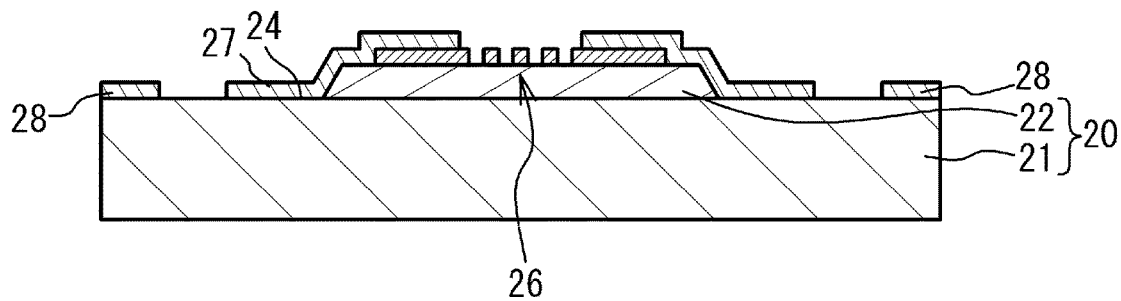

As illustrated in FIG. 5B, after a piezoelectric substrate is bonded to the surface of the support substrate 21, the piezoelectric substrate is thinned by polishing or grinding to form the piezoelectric layer 22. The support substrate 21 and the piezoelectric substrate are bonded to each other using, for example, a direct bonding method in which the surface of the support substrate 21 and the surface of the piezoelectric substrate are activated and bonded at room temperature. The support substrate 21 and the piezoelectric layer 22 form the substrate 20. Then, the piezoelectric layer 22 is etched to be patterned. The acoustic wave elements 26 are formed on the piezoelectric layer 22. The wiring lines 27 electrically connected to the acoustic wave elements 26 are formed. The metal layer 28 is formed in the region to which the ring-shaped metal layer 60 is bonded. The acoustic wave elements 26, the wiring lines 27, and the metal layer 28 are formed using a commonly known method. Through the above steps, the substrate 20 having the acoustic wave elements 26 and the like is formed.

Figure 5C:

As illustrated in FIG. 5C, after a metallic foil 90 is processed so as to have the same outer shape as the substrate 10 and the substrate 20, toric apertures are formed by removing the metallic foil 90 around the regions where the pillars 61 and 62 are to be formed. An insulating resin is filled in the aperture and cured to form the insulating resin film 72. The aperture has a width of, for example, 60 μm, and the metallic foil 90 in the inner region of the hollow circular aperture has a diameter of, for example, 120 μm. The metallic foil 90 is removed by, for example, wet etching.

Figure 5D:
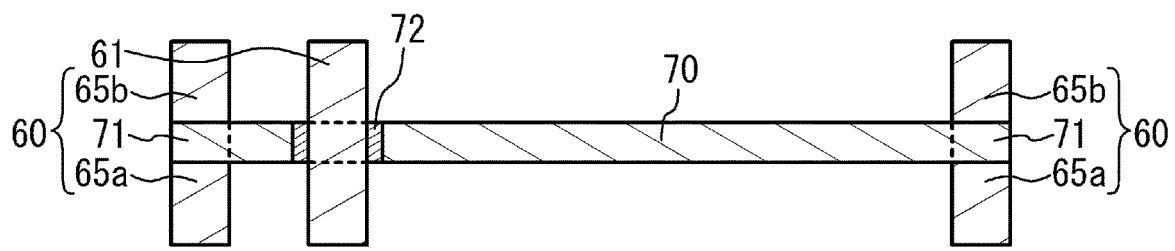

As illustrated in FIG. 5D, metal layers are formed on both surfaces of the metallic foil 90 by, for example, electroforming. This forms the shield metal layer 70 formed of the metallic foil 90, the ring-shaped metal layer 60 including the part 71 of the shield metal layer 70 and the post portions 65a and 65b, and the pillars 61 to 63 (only the pillar 61 is illustrated in FIG. 5D) including a part of the metallic foil 90. The diameters of the pillars 61 to 63 and the width of the ring-shaped metal layer 60 are, for example, 100 μm. The pillars 61 to 63 and the ring-shaped metal layer 60 have a structure in which, for example, a copper layer with a thickness of 20 μm, a nickel layer with a thickness of 5 μm, and a tin layer with a thickness of 5 μm are stacked in this order from the shield metal layer 70 side.

Figure 6A:
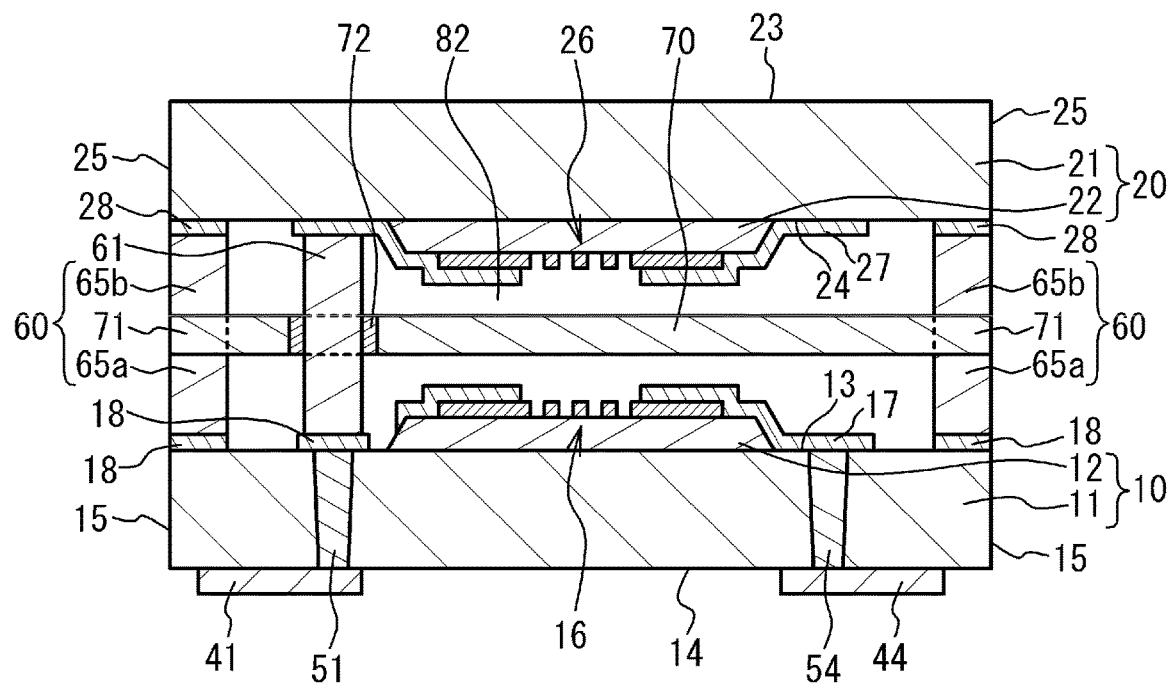
FIG. 6A and FIG. 6B are cross-sectional views (No. 2) illustrating the method of manufacturing the acoustic wave device in accordance with the first embodiment.

As illustrated in FIG. 6A, the pillars 61 to 63 and the ring-shaped metal layer 60 are bonded to the metal layer 18 of the substrate 10. For example, the pillars 61 to 63 and the ring-shaped metal layer 60 are heated to 250° C. and pressurized under a nitrogen atmosphere to be solder-bonded to the metal layer 18 of the substrate 10. Similarly, the pillars 61 to 63 are bonded to the wiring lines 27 of the substrate 20, and the ring-shaped metal layer 60 is bonded to the metal layer 28. For example, the pillars 61 to 63 are heated to 250° C. and pressurized under a nitrogen atmosphere to be solder-bonded to the wiring lines 27 of the substrate 20, and the ring-shaped metal layer 60 is heated to 250° C. and pressurized under a nitrogen atmosphere to be solder-bonded to the metal layer 28.

Figure 6B:
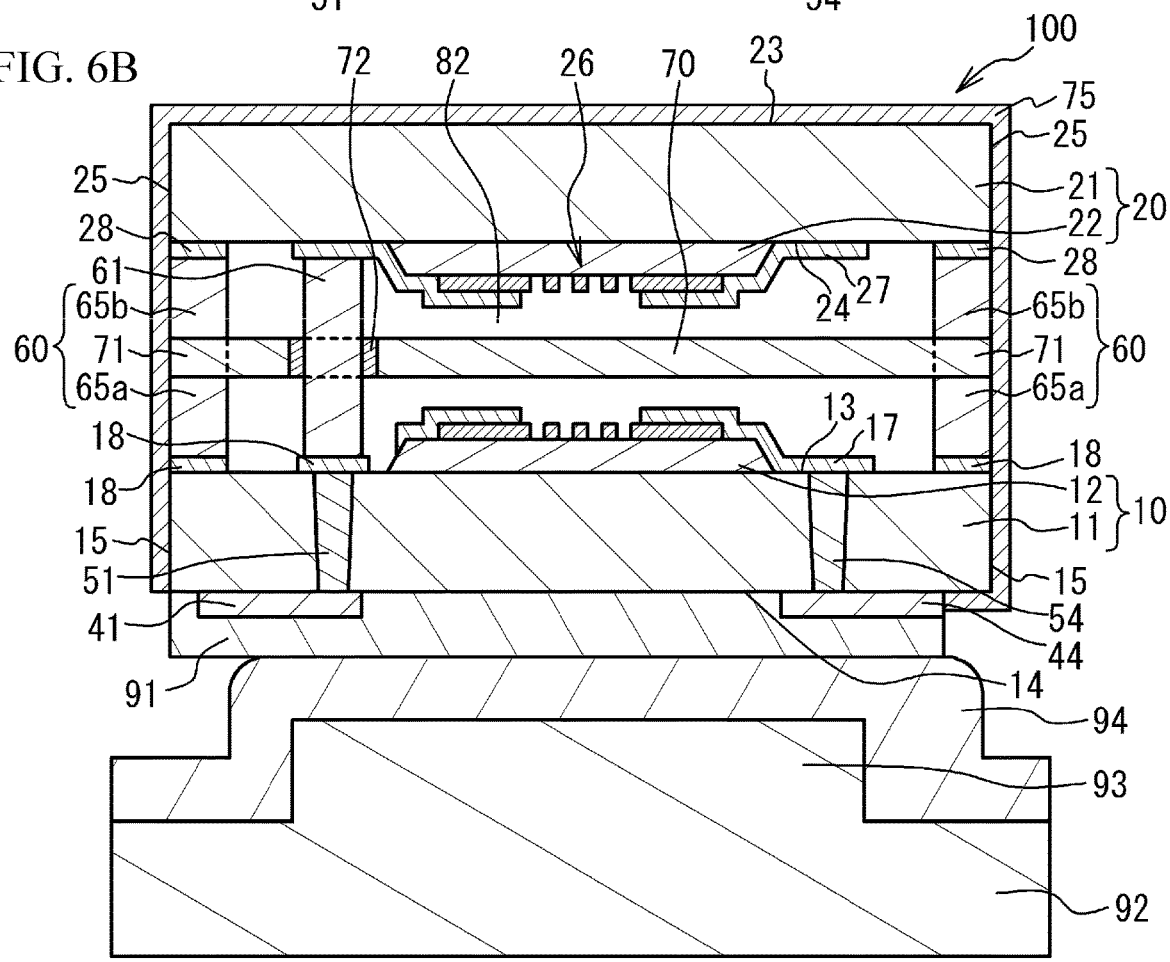

As illustrated in FIG. 6B, a resist film 91 covering the region other than the region where the covering metal layer 75 is to be formed is formed on the lower surface 14 of the substrate 10. After the substrate 10 and the substrate 20 are separated into individual chips by dicing, the chip is fixed to a protrusion portion 93 of a substrate 92, which has a protrusion, using a tape 94 or the like. The width of the protrusion portion 93 is less than the chip size (for example, less than the chip size by 200 μm or greater), only the region where the resist film 91 is formed is attached to the tape 94, and the region where no resist film 91 is formed is separated from the tape 94. Then, a metal film is deposited on the chip fixed to the substrate 92 by sputtering. The metal film is formed across the entire surface of the chip except the region where the resist film 91 is formed. In this manner, the acoustic wave device 100 of the first embodiment having the covering metal layer 75 on the surface thereof is formed. Finally, the acoustic wave device 100 is detached from the tape 94, and the resist film 91 is removed to complete the acoustic wave device 100.

First Variation of the First Embodiment

Figure 7:
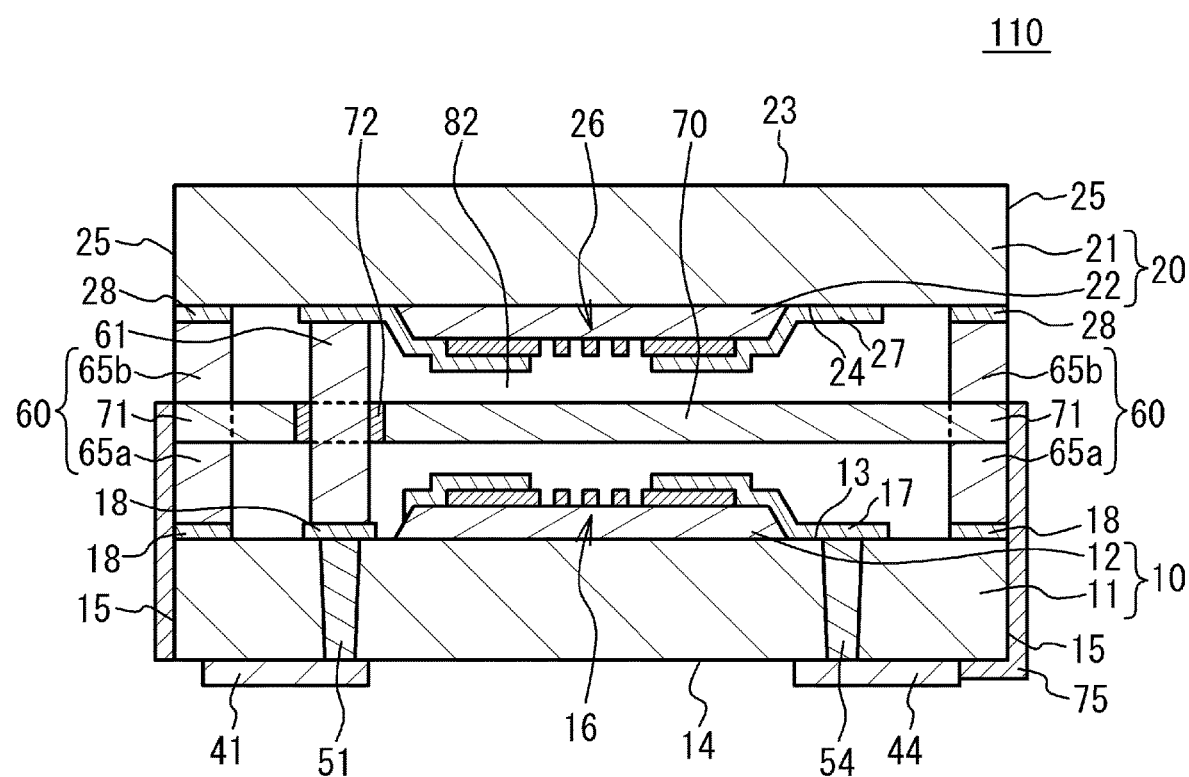
FIG. 7 is a cross-sectional view of an acoustic wave device in accordance with a first variation of the first embodiment.
Figure 8A:
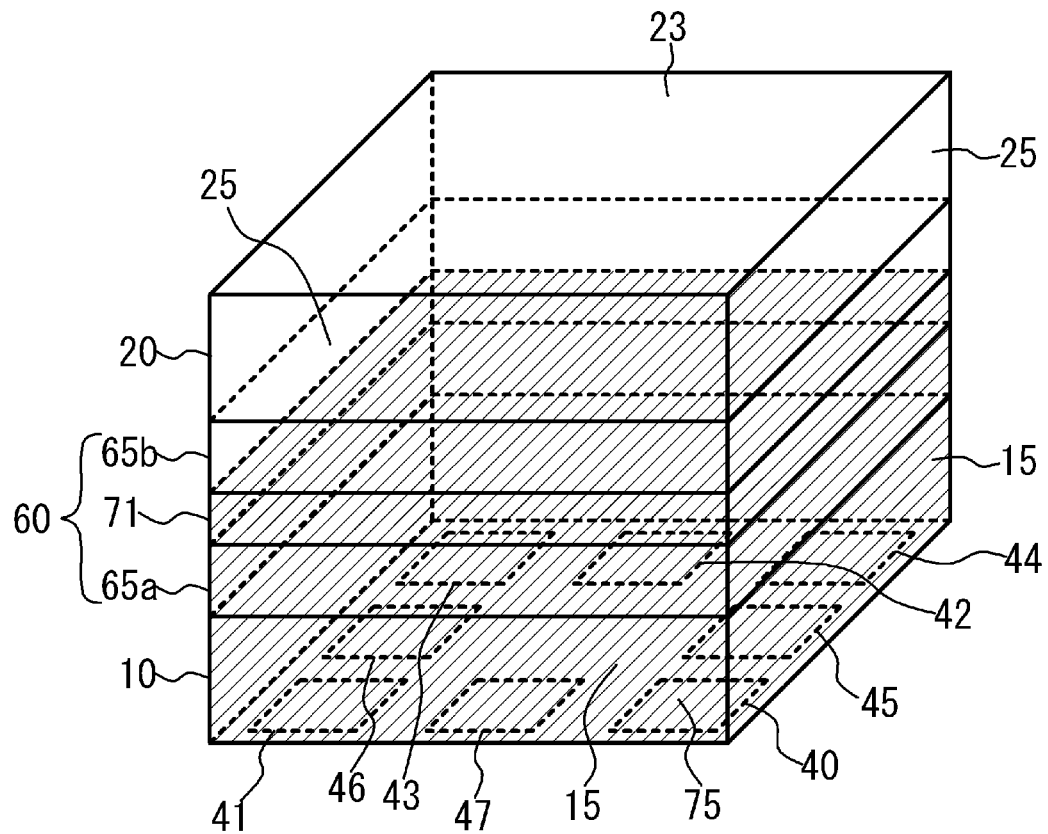
FIG. 8A is a perspective view of the acoustic wave device, illustrating the covered region with the covering metal layer in the first variation of the first embodiment.
Figure 8B:
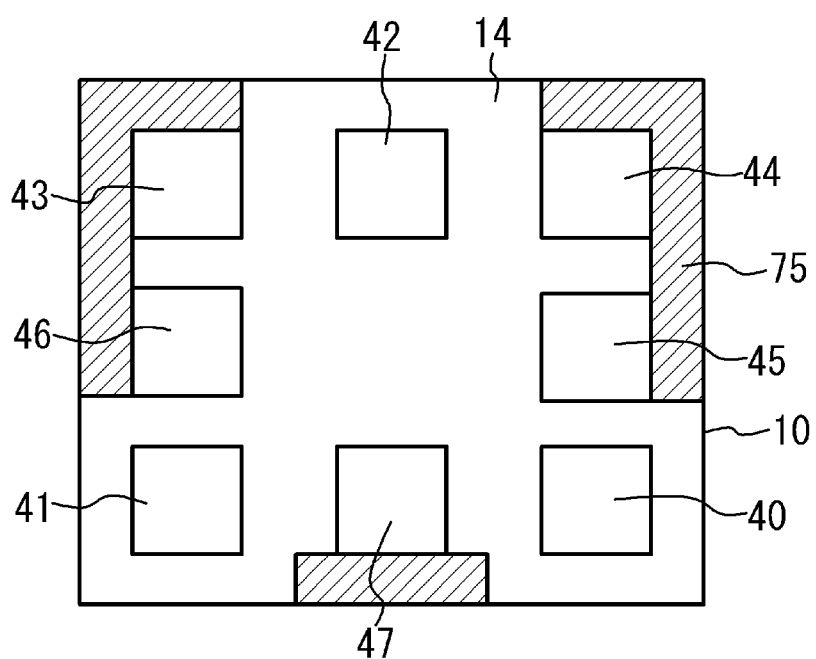
FIG. 8B is a plan view illustrating the lower surface of the substrate.

FIG. 7 is a cross-sectional view of an acoustic wave device in accordance with a first variation of the first embodiment. FIG. 8A is a perspective view of the acoustic wave device illustrating the covered region with the covering metal layer in the first variation of the first embodiment, and FIG. 8B is a plan view illustrating the lower surface of the substrate. In FIG. 8A and FIG. 8B, for clarity of the drawings, the region where the covering metal layer 75 is provided is indicated by hatching. FIG. 8B is a transparent plan view of the lower surface 14 as viewed from above the substrate 10. As illustrated in FIG. 7 and FIG. 8A, in an acoustic wave device 110 of the first variation of the first embodiment, the covering metal layer 75 covers the entire surfaces of all side surfaces 15 of the substrate 10, the outer surface of the post portion 65a, which is a part of the outer surface of the ring-shaped metal layer 60, and the entire outer surface of the part 71 of the shield metal layer 70. As illustrated in FIG. 8B, the covering metal layer 75 extends from the side surfaces 15 to the lower surface 14 of the substrate 10 as in the first embodiment, and is in contact with the ground terminals 43 to 47 and is electrically connected to the ground terminals 43 to 47. Other configurations are the same as those of the first embodiment, and the description thereof is thus omitted.

COMPARATIVE EXAMPLES

Figure 9A:
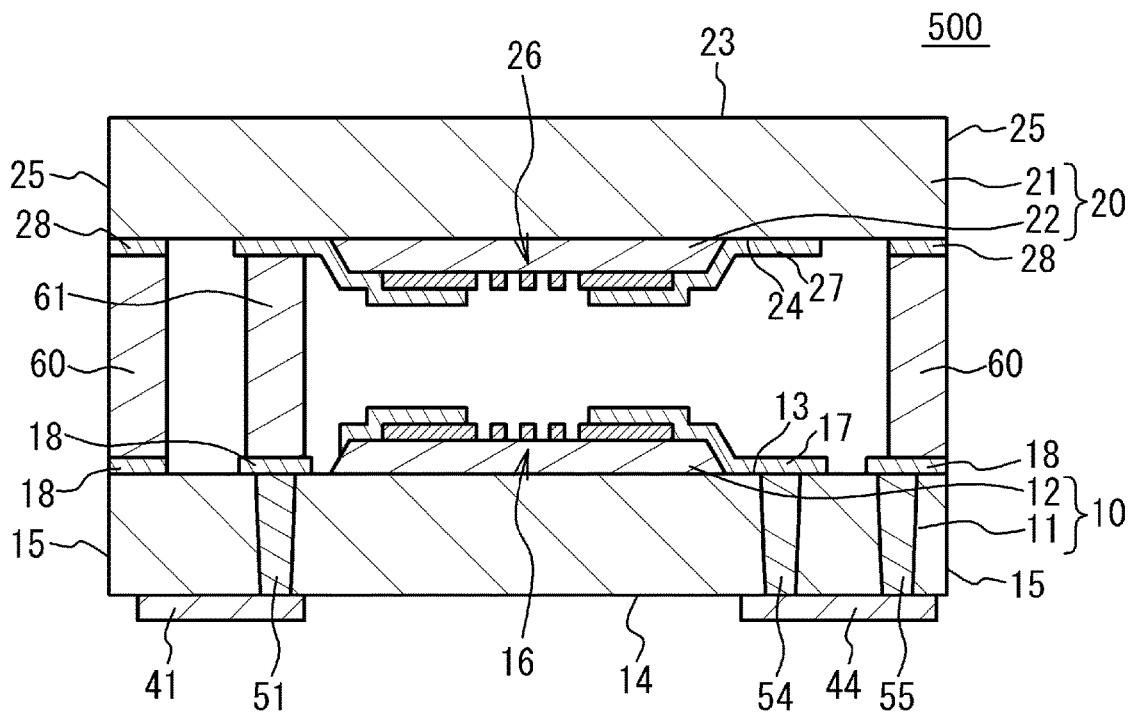
FIG. 9A is a cross-sectional view of an acoustic wave device in accordance with a first comparative example.
Figure 9B:
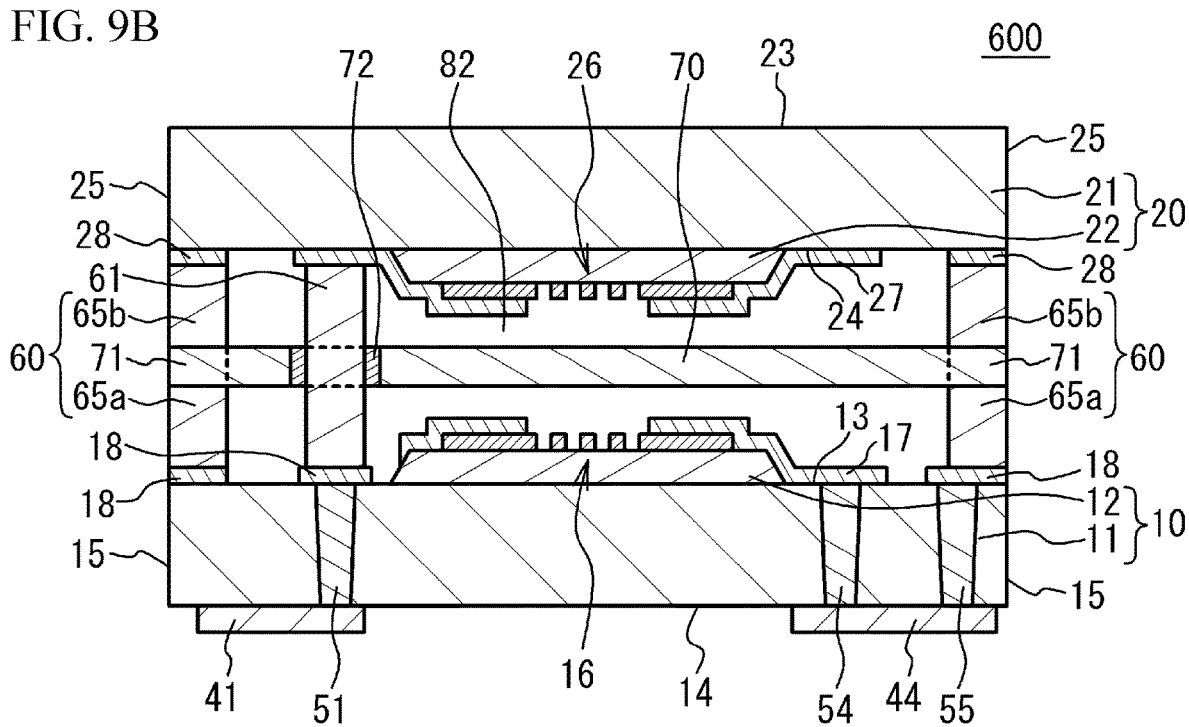
FIG. 9B is a cross-sectional view of an acoustic wave device in accordance with a second comparative example.
Figure 10:
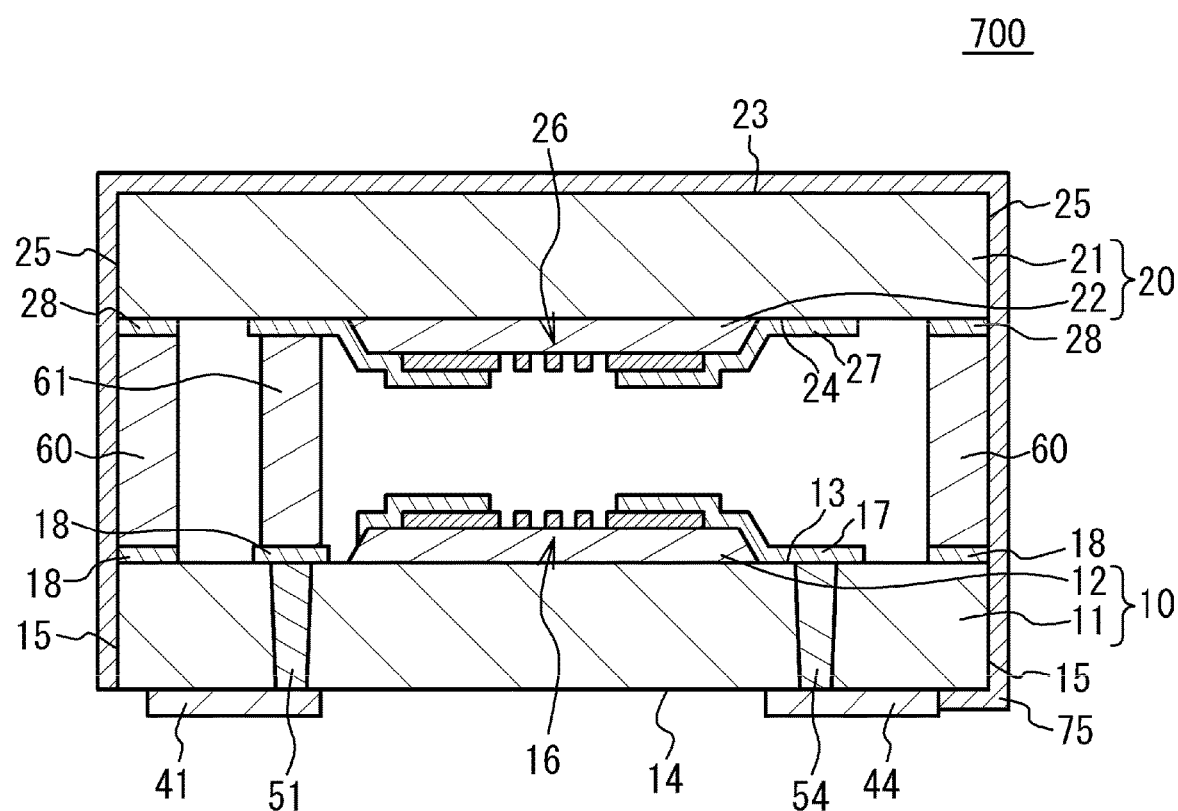
FIG. 10 is a cross-sectional view of an acoustic wave device in accordance with a third comparative example.

FIG. 9A is a cross-sectional view of an acoustic wave device in accordance with a first comparative example, FIG. 9B is a cross-sectional view of an acoustic wave device in accordance with a second comparative example, and FIG. 10 is a cross-sectional view of an acoustic wave device in accordance with a third comparative example. As illustrated in FIG. 9A, in an acoustic wave device 500 of the first comparative example, no shield metal layer 70 is provided between the substrate 10 and the substrate 20, and no covering metal layer 75 electrically connected to the shield metal layer 70 is provided. The ring-shaped metal layer 60 is electrically connected to the ground terminal 44 through a via wiring 55 provided in the substrate 10. Other configurations are the same as those of the first embodiment, and the description thereof is thus omitted.

As illustrated in FIG. 9B, in an acoustic wave device 600 of the second comparative example, no covering metal layer 75 is provided, and the ring-shaped metal layer 60 and the shield metal layer 70 are electrically connected to the ground terminal 44 through the via wiring 55 provided in the substrate 10. Other configurations are the same as those of the first embodiment, and the description thereof is thus omitted.

As illustrated in FIG. 10, in an acoustic wave device 700 of the third comparative example, no shield metal layer 70 is provided between the substrate 10 and the substrate 20. Other configurations are the same as those of the first embodiment, and the description thereof is thus omitted.

Simulation 1

The isolation of the acoustic wave devices of the first embodiment, the first comparative example, and the second comparative example was simulated. The simulation conditions are as follows.

Figure 11:
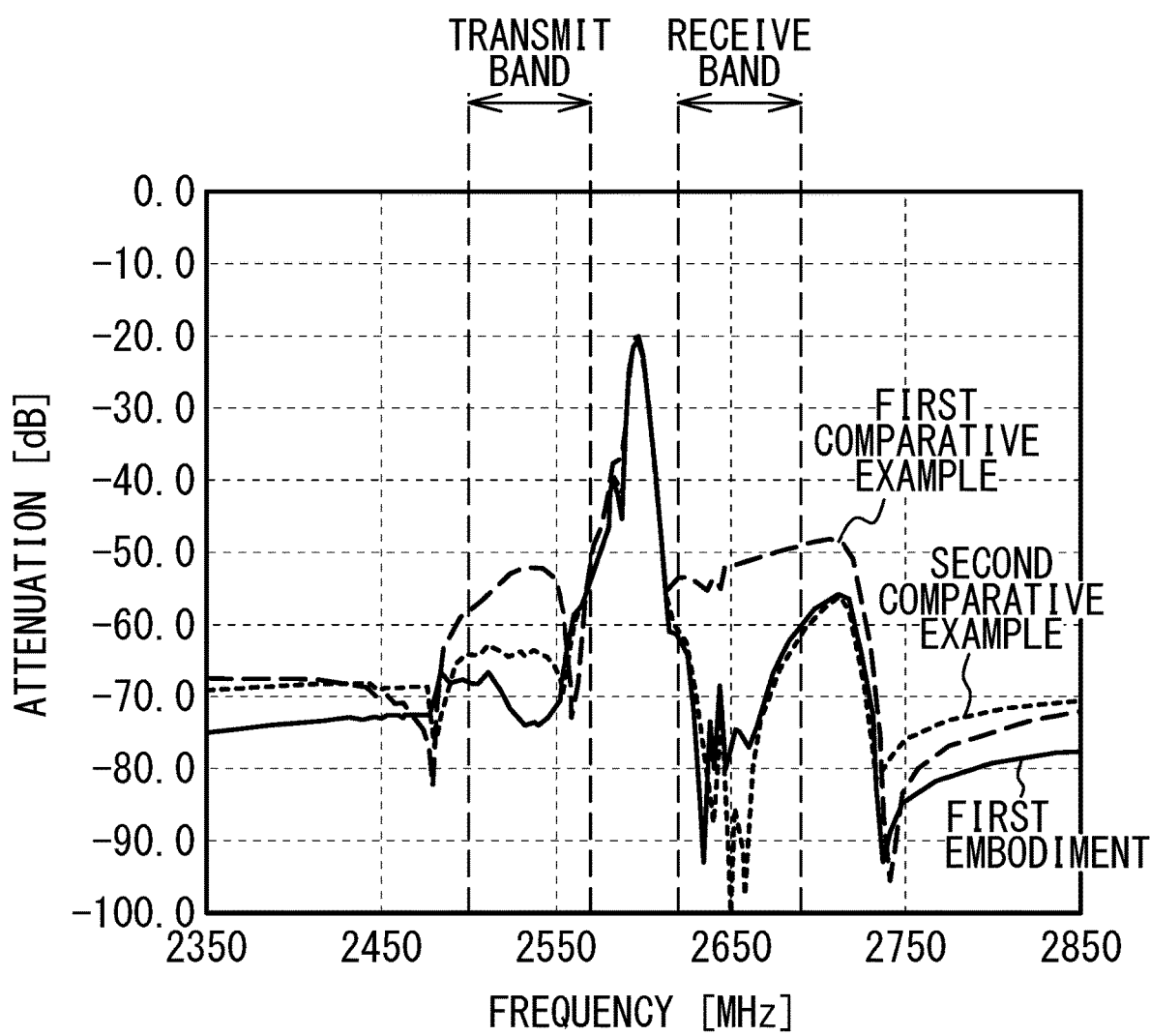
FIG. 11 illustrates isolation characteristics of the acoustic wave devices of the first embodiment, the first comparative example, and the second comparative example.

Support substrates 11 and 21: Sapphire substrate with a thickness of 75 µm
Piezoelectric layers 12 and 22: 42° rotated Y-cut X-propagation lithium tantalate layer with a thickness of 1 µm
Via wirings 50 to 55: Copper film with a diameter of 40 µm
Ring-shaped metal layer 60: Multilayered film in which a kovar layer with a thickness of 30 µm is sandwiched between copper layers with a thickness of 20 µm
Shield metal layer 70: Kovar layer with a thickness of 30 µm
Covering metal layer 75: Gold layer with a thickness of 1 µm
Transmit band of the transmit filter 19: 2500 MHz to 2570 MHz
Receive band of the receive filter 29: 2620 MHz to 2690 MHz FIG. 11 illustrates isolation characteristics of the acoustic wave devices of the first embodiment, the first comparative example, and the second comparative example. The horizontal axis in FIG. 11 represents frequency [MHz], and the vertical axis represents attenuation [dB]. The attenuation indicates the leakage of the transmission signal to the receive terminal 41. The larger absolute value of the attenuation indicates higher isolation, and the smaller absolute value of the attenuation indicates lower isolation (hereinafter, the same applies to similar drawings).

As illustrated in FIG. 11, in the transmit band of 2500 MHz to 2570 MHz and the receive band of 2620 MHz to 2690 MHz, the isolation characteristics of the first embodiment and the second comparative example are improved compared with that of the first comparative example. This is considered because in the first embodiment and the second comparative example, the shield metal layer 70, to which a ground potential is supplied, is provided between the acoustic wave elements 16 forming the transmit filter 19 and the acoustic wave elements 26 forming the receive filter 29. In other words, this is considered because the shield metal layer 70 shields the electromagnetic wave of the transmit filter 19, and thereby the electromagnetic field coupling between the transmit filter 19 and the receive filter 29 is inhibited.

In the lower-side floor region (around 2350 MHz to 2450 MHz) lower in frequency than the transmit band and the higher-side floor region (around 2750 MHz to 2850 MHz) higher in frequency than the receive band, the isolation characteristic of the first embodiment is improved compared with that of the second comparative example. This reason is considered as follows. In the second comparative example, the shield metal layer 70 is supplied with a ground potential by being connected to the ground terminal 44 through the via wiring 55 provided in the substrate 10. In this case, the inductance component of the via wiring 55 inhibits the grounding performance of the shield metal layer 70 from being sufficiently high, and as a result, the isolation characteristic is difficult to improve in the lower-side floor region and the higher-side floor region in the second comparative example. On the other hand, in the first embodiment, the shield metal layer 70 is supplied with a ground potential by being connected to the ground terminals 43 to 47 through the covering metal layer 75 covering the side surfaces 15 of the substrate 10. This reduces the inductance component and improves the grounding performance of the shield metal layer 70, and as a result, the isolation characteristics in the lower-side floor region and the higher-side floor region are improved in the first embodiment. In addition, in the first embodiment, the grounding performance of the shield metal layer 70 is improved. Thus, compared with the second comparative example, the isolation characteristic in the transmit band is also improved.

The simulation obtained results where the isolation at 2400 MHz (the lower-side floor region) in the first embodiment was improved by approximately 5.3 dB compared with that in the second comparative example, and the isolation at 2800 MHz (the higher-side floor region) in the first embodiment was improved by approximately 7.4 dB compared with that in the second comparative example. In addition, the isolation characteristic in the transmit band of the first embodiment was improved by approximately 3.7 dB compared with that in the second comparative example.

In the second comparative example, it may be considered to improve the grounding performance of the shield metal layer 70 by increasing the number of the via wirings that are provided in the support substrate 11 to electrically connect the ring-shaped metal layer 60 and the shield metal layer 70 to the ground terminal. However, due to the influence of the inductance components of the via wirings and the like, the grounding performance of the shield metal layer 70 is not sufficiently improved, and the improvement in the isolation characteristics does not become sufficiently high. In addition, since a plurality of via wirings are formed, the locations where the via wirings can be formed are limited by the locations where terminals are formed and the like. Thus, the improvement in isolation characteristics varies depending on the device, and it is difficult to obtain a stable improvement effect. Further, formation of a plurality of via wirings results in decrease in the strength of the substrate. In addition, when the ring-shaped metal layer 60 and the shield metal layer 70 are electrically connected to the ground terminal using a via wiring and/or a through-hole, increase in the number of via wirings and/or the number of through-holes may reduce the area that can be designed on the substrate. However, by connecting the ring-shaped metal layer 60 and the shield metal layer 70 to the ground terminal through not only the via wiring but also the covering metal layer 75, the area that can be designed is secured.

Simulation 2

The isolation of the acoustic wave devices of the first embodiment, the first variation of the first embodiment, and the second comparative example was simulated. The simulation conditions were the same as those of the above simulation 1.

Figure 12:
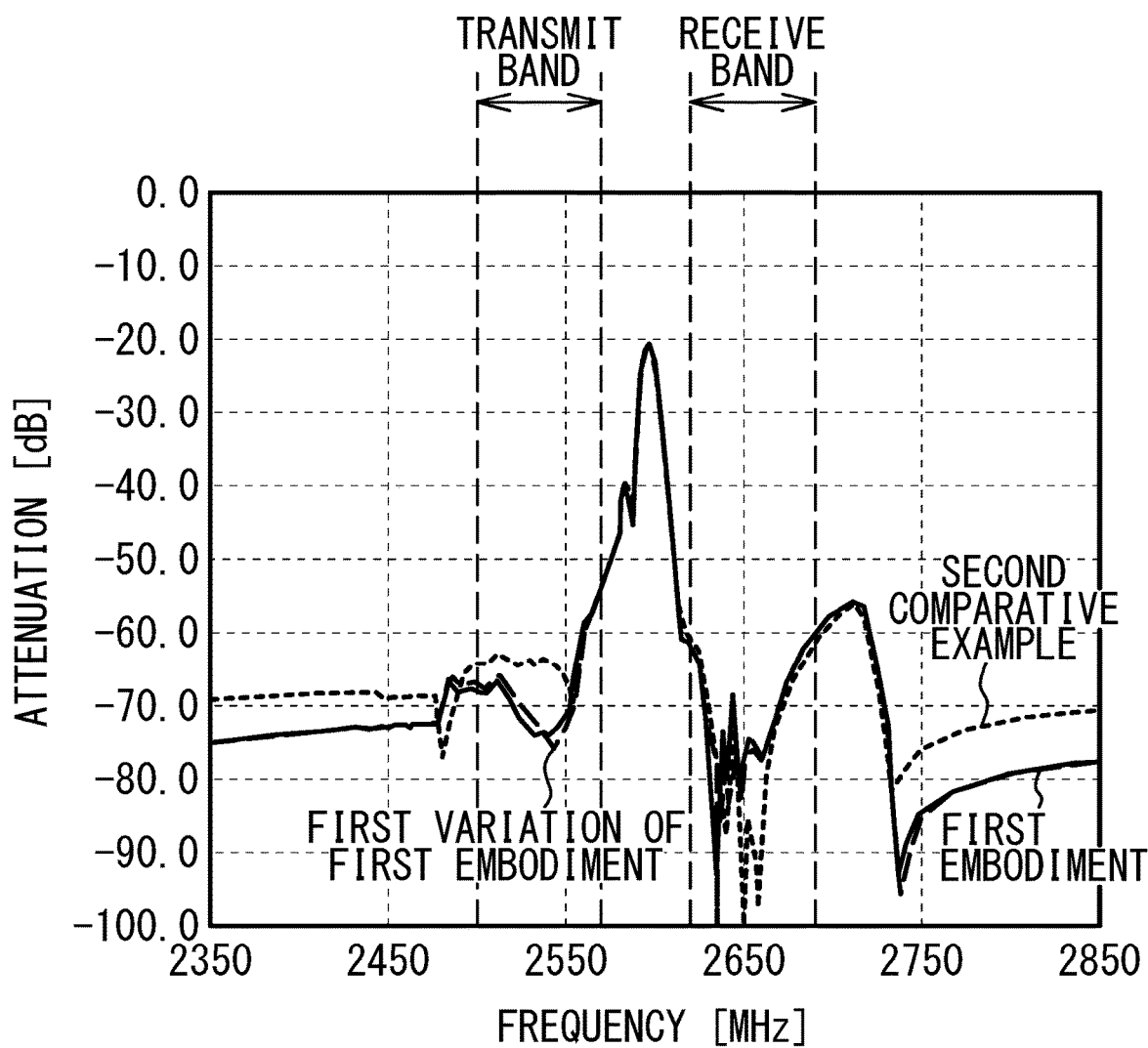
FIG. 12 illustrates isolation characteristics of the acoustic wave devices of the first embodiment, the first variation of the first embodiment, and the second comparative example.

FIG. 12 illustrates isolation characteristics of the acoustic wave devices of the first embodiment, the first variation of the first embodiment, and the second comparative example. In FIG. 12, the horizontal axis represents frequency [MHz], and the vertical axis represents attenuation [dB]. As illustrated in FIG. 12, the first variation of the first embodiment improves the isolation characteristics to the same extent as the first embodiment. In the first variation of the first embodiment, the covering metal layer 75 covers only the side surfaces 15 of the substrate 10, the post portion 65a, which is located closer to the substrate 10, of the ring-shaped metal layer 60, and the part 71 of the shield metal layer 70. Thus, the simulation result of FIG. 12 indicates that the isolation characteristic can be improved sufficiently even by covering only a part of the acoustic wave device with the covering metal layer 75.

Simulation 3

The isolation of the acoustic wave devices of the first embodiment, the first comparative example, and the third comparative example was simulated. The simulation conditions were the same as those of the above simulation 1.

Figure 13:
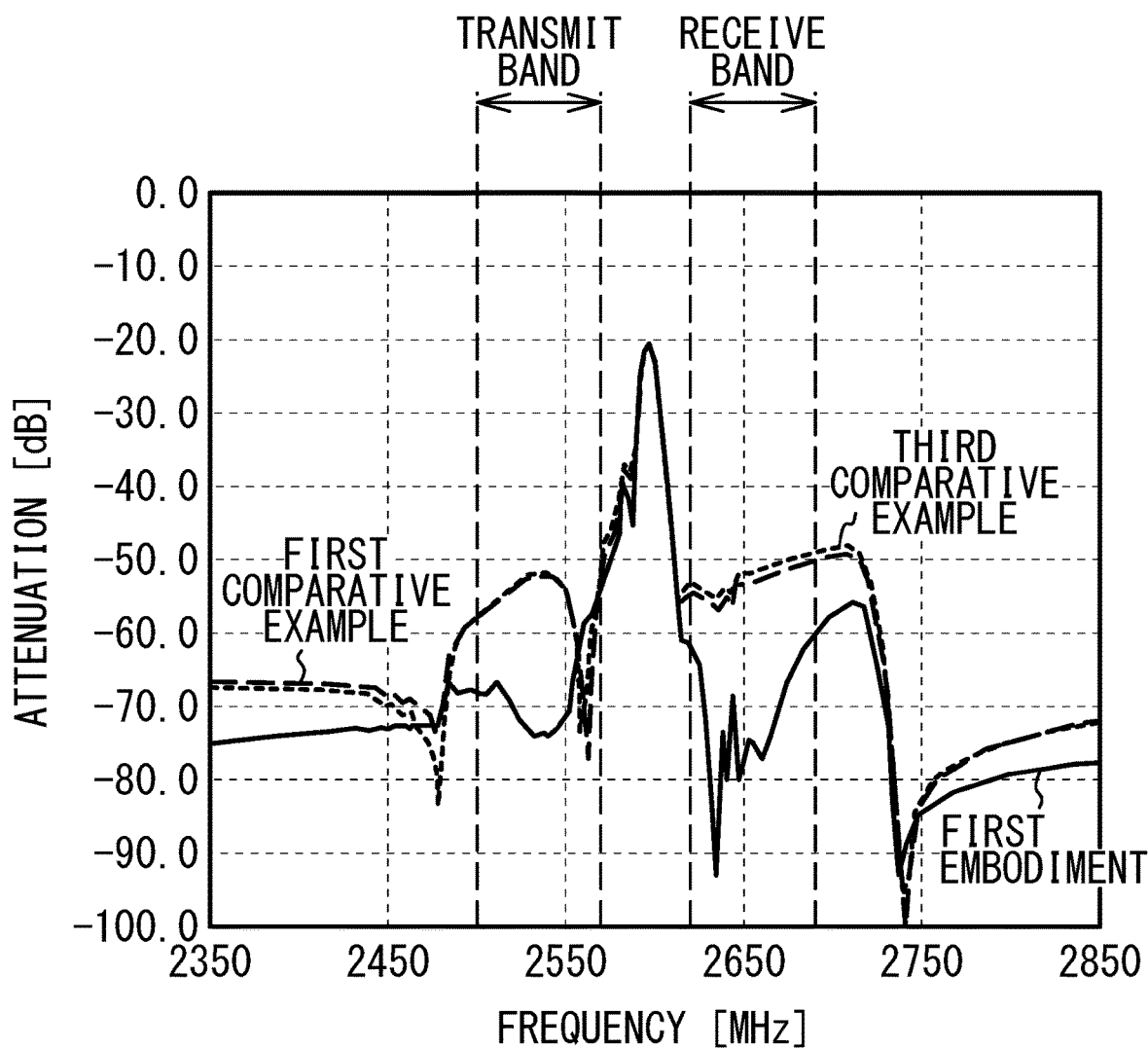
FIG. 13 illustrates isolation characteristics of the acoustic wave devices of the first embodiment, the first comparative example, and the third comparative example.

FIG. 13 illustrates isolation characteristics of the acoustic wave devices of the first embodiment, the first comparative example, and the third comparative example. In FIG. 13, the horizontal axis represents frequency [MHz], and the vertical axis represents attenuation [dB]. As illustrated in FIG. 13, the first comparative example and the third comparative example have similar isolation characteristics. In the third comparative example, the covering metal layer 75 is provided, but no shield metal layer 70 is provided. Therefore, the simulation result of FIG. 13 indicates that the improvement in isolation characteristics is small when only the covering metal layer 75 is provided without providing the shield metal layer 70. That is, the simulation result indicates that the isolation characteristics can be improved by providing both the shield metal layer 70 and the covering metal layer 75 to improve the grounding performance of the shield metal layer 70.

Second and Third Variations of the First Embodiment

Figure 14A:
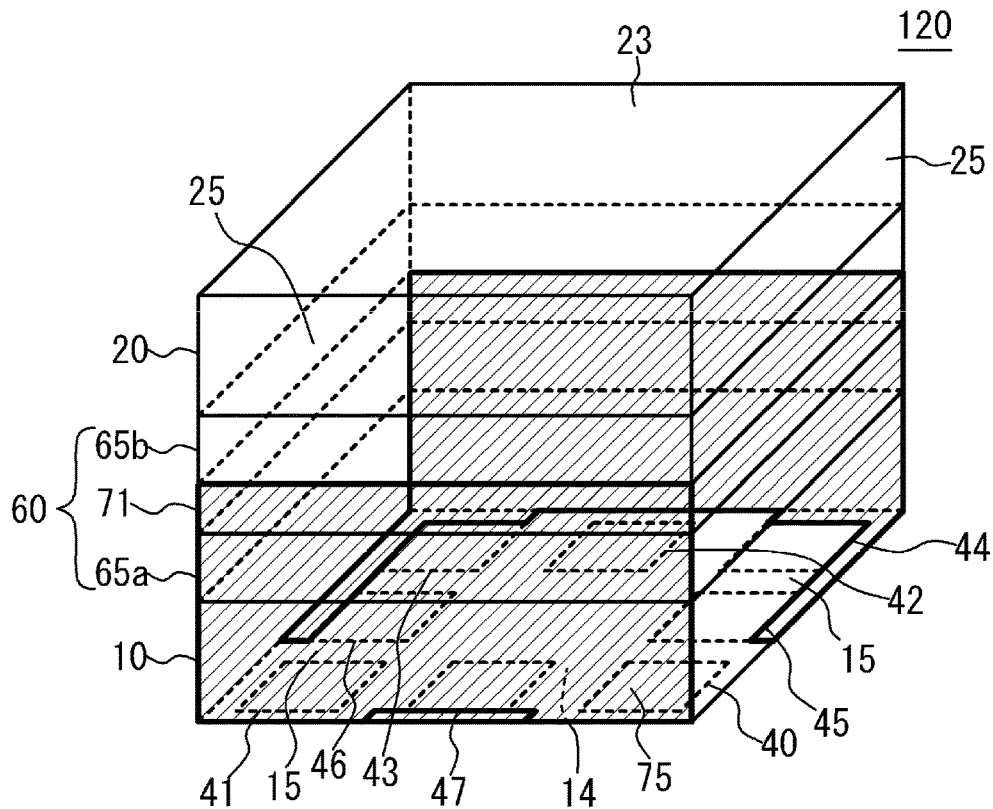
FIG. 14A and FIG. 14B are perspective views of acoustic wave devices, illustrating the covered region with the covering metal layer in second and third variations of the first embodiment, respectively.
Figure 14B:
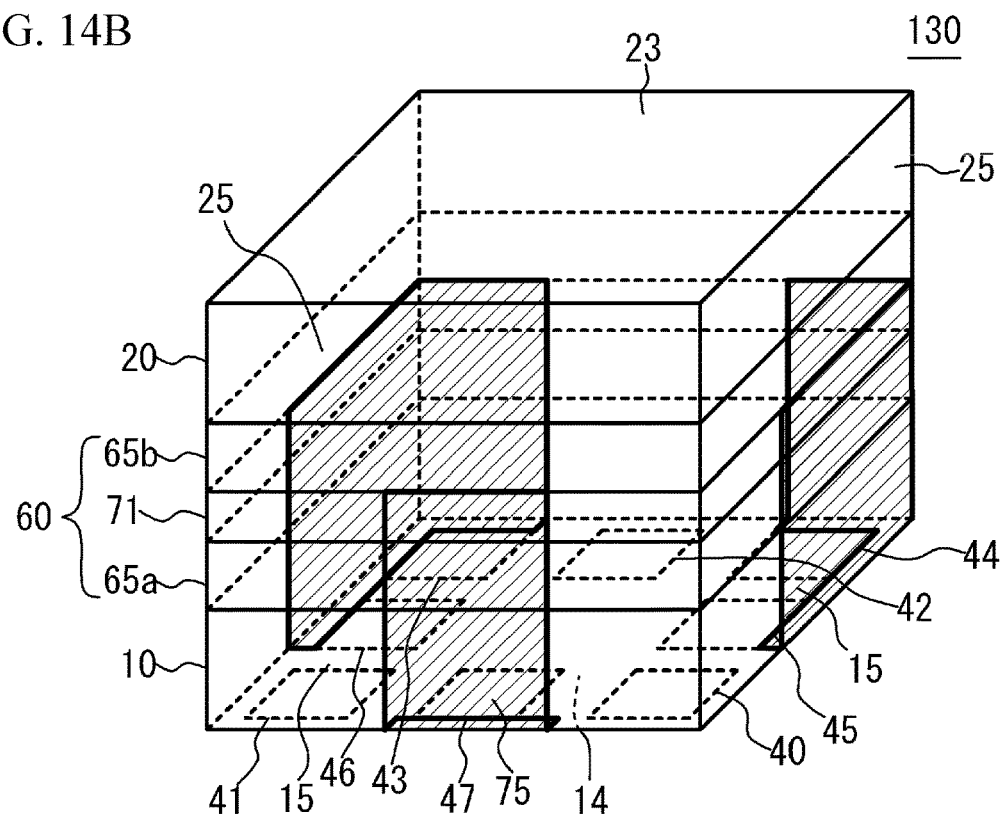

FIG. 14A and FIG. 14B are perspective views of acoustic wave devices illustrating the covered region with the covering metal layer in second and third variations of the first embodiment, respectively. In FIG. 14A and FIG. 14B, for clarity of the drawings, the region where the covering metal layer 75 is provided is indicated by hatching, and the outer shape of the covering metal layer 75 is indicated by a bold line. As illustrated in FIG. 14A, in an acoustic wave device 120 of the second variation of the first embodiment, the covering metal layer 75 is provided on two side surfaces 15 opposite to each other among the side surfaces 15 of the substrate 10. The side surfaces 15 provided with the covering metal layer 75 are not limited to the side surfaces 15 opposite to each other, and may be the side surfaces 15 next to each other. Although the illustration is omitted, the covering metal layer 75 may be provided on three side surfaces 15 among the side surfaces 15 of the substrate 10. As illustrated in FIG. 14B, in an acoustic wave device 130 of the third variation of the first embodiment, the covering metal layer 75 is provided on the side surfaces 15 of the substrate 10 so as to linearly extend from the parts adjacent to the ground terminals 43 to 47 among sides of the lower surface 14 of the substrate 10 to the respective side surfaces 15 of the substrate 10. As described above, as long as the covering metal layer 75 covers half or more of the total area of the side surfaces 15 of the substrate 10, how the covering metal layer 75 covers the side surfaces 15 is not limited.

In the first embodiment and the variations thereof, the shield metal layer 70 (a first metal layer) is provided between the acoustic wave elements 16 disposed on the substrate 10 and the acoustic wave elements 26 disposed on the substrate 20. The shield metal layer 70 is electrically connected to the ground terminal 44 by the covering metal layer 75 (a second metal layer) covering half or more of the total area of the side surfaces 15 of the substrate 10. This improves the grounding performance of the shield metal layer 70, which enhances the electromagnetic shielding effect and improves the isolation characteristics. In addition, since the covering metal layer 75 covering the side surfaces 15 of the substrate 10 is provided, the electromagnetic field coupling between the acoustic wave elements 16 disposed on the substrate 10 and a device outside the acoustic wave device 100 is inhibited. The ratio of the area covered with the covering metal layer 75 to the total area of the side surfaces 15 can be obtained as follows, for example. The limits of the substrate 10 is determined in the X-ray image, the optical microscope image, or the SEM image of the cross-section of the acoustic wave device, and then the area defined by the limits is measured in the X-ray image, the optical microscope image, or the SEM image.

The covering metal layer 75 preferably covers a plurality of the side surfaces 15 from first ends, which are at the upper surface 13 side, of the side surfaces 15 of the substrate 10 to second ends, which are at the lower surface 14 side, of the side surfaces 15. To improve the grounding performance of the shield metal layer 70, it is preferable that the covering metal layer 75 is provided on two or more side surfaces 15 of the side surfaces 15 of the substrate 10 and covers at least a part of each of the two or more side surfaces 15, and it is more preferable that the covering metal layer 75 is provided on three or more side surfaces 15 and covers at least a part of each of the three or more side surfaces 15. It is further preferable that the covering metal layer 75 is provided on each of the side surfaces 15 of the substrate 10 and covers at least a part of each of the side surfaces 15.

To improve the grounding performance of the shield metal layer 70, the covering metal layer 75 covers preferably 60% or more of the total area of the side surfaces 15 of the substrate 10, more preferably 75% or more of the total area of the side surfaces 15 of the substrate 10, further preferably 90% or more of the total area of the side surfaces 15 of the substrate 10, yet further preferably the entire surfaces of the side surfaces 15 of the substrate 10. That is, it is yet further preferable that the covering metal layer 75 is provided on each of the side surfaces 15 of the substrate 10 and covers the entire of each of the side surfaces 15.

The covering metal layer 75 is preferably in contact with at least a part of the surface of the ring-shaped metal layer 60 from the side surface 15 of the substrate 10. This allows the shield metal layer 70 to be electrically connected to the ground terminal 44 through the covering metal layer 75 by a simple structure. The post portions 65a and 65b may be formed of an insulating material instead of a metal material. In this case, the covering metal layer 75 preferably extends from the side surface 15 of the substrate 10 to the surface of the part 71 of the shield metal layer 70.

When the acoustic wave elements 16 and 26 are sealed in the air gap 82 between the substrate 10 and the substrate 20 by the ring-shaped metal layer 60, the covering metal layer 75 preferably covers surfaces extending from the side surfaces 15 of the substrate 10 to the side surfaces 25 and the upper surface 23 of the substrate 20 through the surface of the ring-shaped metal layer 60. Since the covering metal layer 75 is provided on the side surfaces 15 and the upper surface 23 of the substrate 20, the electromagnetic field coupling between the acoustic wave elements 26 disposed on the substrate 20 and an external device can be inhibited. Thus, the deterioration in characteristics can be reduced. The covering metal layer 75 covers preferably half or more of the total area of the side surfaces 25 and the upper surface 23 of the substrate 20, more preferably ¾ or more of the total area of the side surfaces 25 and the upper surface 23 of the substrate 20, further preferably the entire of each of the side surfaces 25 and the entire upper surface 23 of the substrate 20.

The shield metal layer 70 may be electrically connected to the ground terminal 44 by both the covering metal layer 75 and the via wiring 55 (see FIG. 9A and FIG. 9B) penetrating through the substrate 10. This allows the area that can be designed on the substrate 10 to be satisfactory secured.

Second Embodiment

Figure 15:
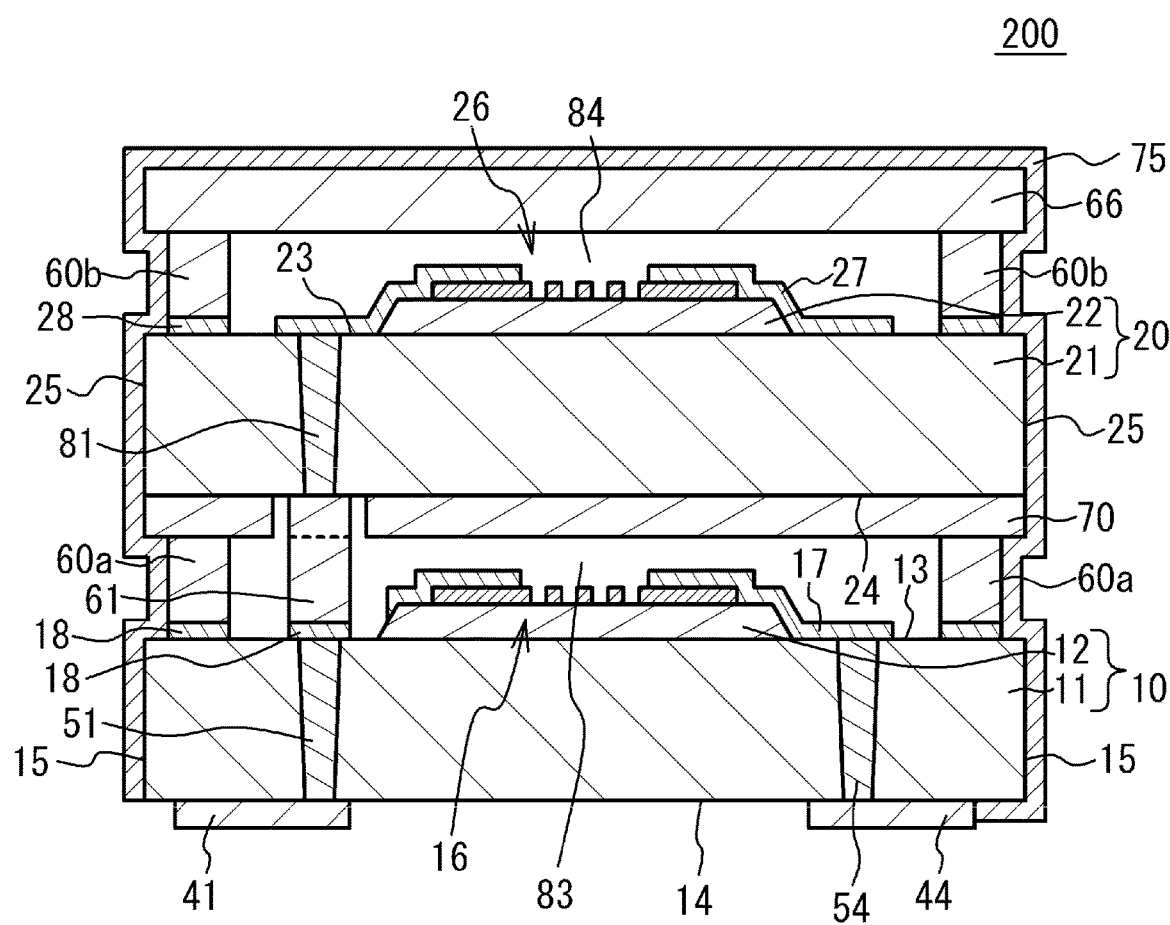
FIG. 15 is a cross-sectional view of an acoustic wave device in accordance with a second embodiment.

FIG. 15 is a cross-sectional view of an acoustic wave device in accordance with a second embodiment. As illustrated in FIG. 15, in an acoustic wave device 200 of the second embodiment, the acoustic wave elements 16 disposed on the substrate 10 and the acoustic wave elements 26 disposed on the substrate 20 are not opposite to each other. That is, the piezoelectric layer 22 is provided on the opposite surface of the support substrate 21 from the surface opposite to the substrate 10, and the acoustic wave elements 26 are disposed on the upper surface 23 of the substrate 20. The acoustic wave elements 26 disposed on the substrate 20 are electrically connected to the receive terminal 41 through a via wiring 81 penetrating through the substrate 20, the pillar 61, and the via wiring 51.

A ring-shaped metal layer 60a is provided between the substrate 10 and the substrate 20 and surrounds the acoustic wave elements 16. The acoustic wave elements 16 are sealed in an air gap 83 (a first air gap) formed between the substrate 10 and the substrate 20 by the ring-shaped metal layer 60a. A ring-shaped metal layer 60b is provided over the upper surface 23 of the substrate 20 and surrounds the acoustic wave elements 26. A lid 66 is provided on the ring-shaped metal layer 60b. The acoustic wave elements 26 are sealed in an air gap 84 (a second air gap) formed between the substrate 20 and the lid 66 by a sealing portion formed of the ring-shaped metal layer 60b and the lid 66.

The shield metal layer 70 is provided on the lower surface 24 of the substrate 20 and is located in the air gap 83. The covering metal layer 75 covers the entire surfaces of all side surfaces 15 of the substrate 10, the entire outer surface of the ring-shaped metal layer 60a, the entire outer surface of the shield metal layer 70, the entire surfaces of all side surfaces 25 of the substrate 20, the entire outer surface of the ring-shaped metal layer 60b, and the entire outer surface of the lid 66. Other configurations are the same as those of the first embodiment, and the description thereof is thus omitted.

Also in the acoustic wave device 200 of the second embodiment, the shield metal layer 70 is electrically connected to the ground terminal 44 by the covering metal layer 75 covering half or more of the total area of the side surfaces 15 of the substrate 10. This improves the grounding performance of the shield metal layer 70, which enhances the electromagnetic shielding effect and improves the isolation characteristics.

When the acoustic wave elements 16 are disposed on the upper surface 13 of the substrate 10 and the acoustic wave elements 26 are disposed on the upper surface 23 of the substrate 20, the covering metal layer 75 preferably covers the surfaces extending from the side surfaces 15 of the substrate 10 to the side surfaces 25 of the substrate 20 and the surface of the sealing portion (the ring-shaped metal layer 60b and the lid 66) through the surface of the ring-shaped metal layer 60a. The covering metal layer 75 provided on the side surfaces 25 of the substrate 20 and the surface of the sealing portion (the ring-shaped metal layer 60b and the lid 66) inhibits the electromagnetic field coupling between the acoustic wave elements 26 disposed on the substrate 20 and an external device. Therefore, the deterioration in characteristics can be reduced. The covering metal layer 75 covers preferably half or more of the total area of the side surfaces 25 of the substrate 20 and the surface of the sealing portion, more preferably ¾ or more of the total area of the side surfaces 25 of the substrate 20 and the surface of the sealing portion, further preferably the entire of each of the side surfaces 25 of the substrate 20 and the entire surface of the sealing portion.

The first embodiment and the second embodiment describe a case where the acoustic wave elements 16 and 26 excite surface acoustic waves, as an example, but the acoustic wave elements 16 and 26 may excite Love waves or boundary acoustic waves.

Third Embodiment

Figure 16A:
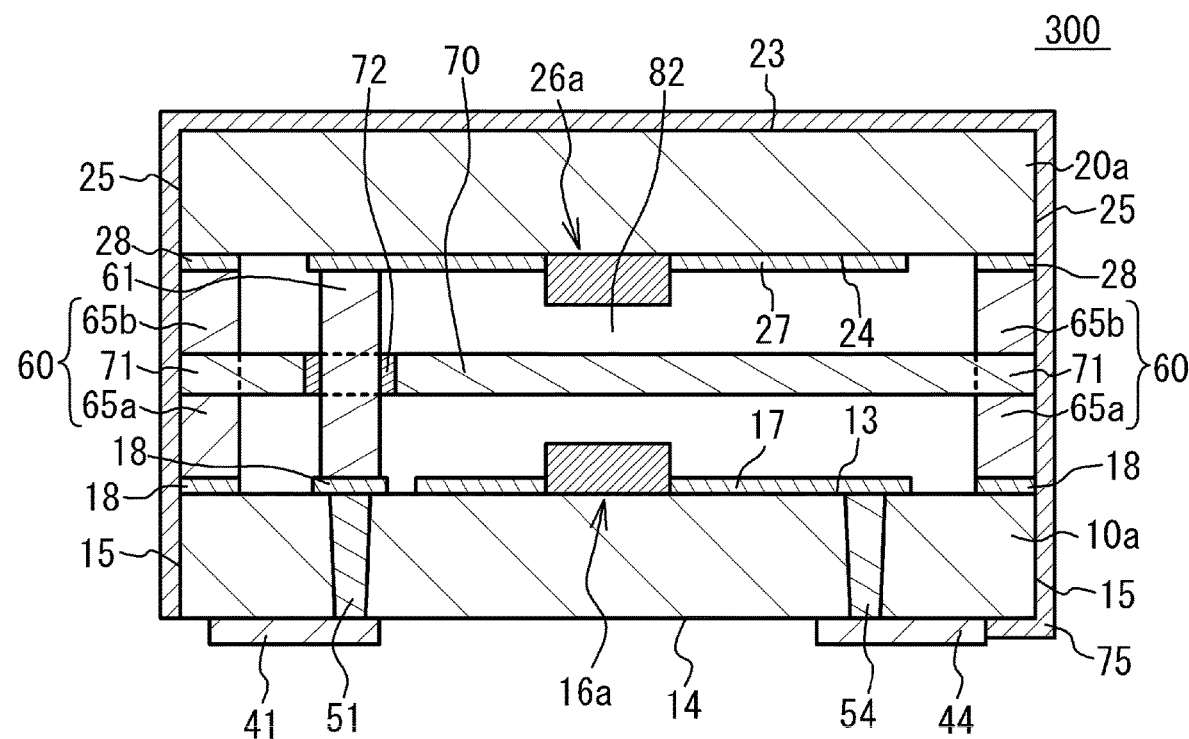
FIG. 16A is a cross-sectional view of an acoustic wave device in accordance with a third embodiment.
Figure 16B:
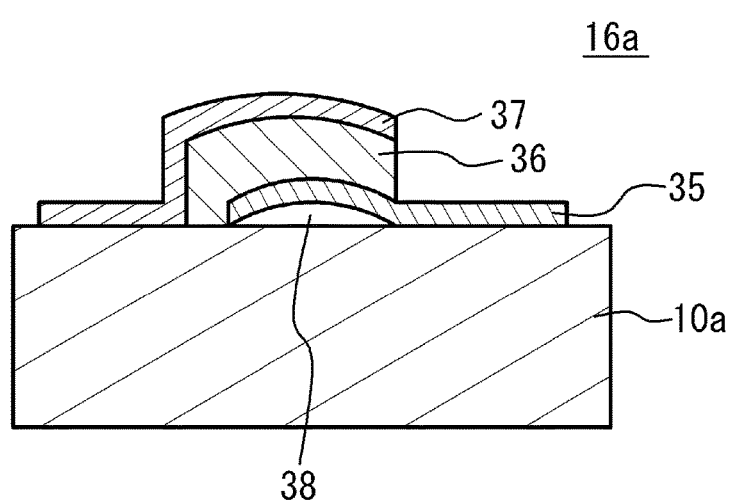
FIG. 16B is a cross-sectional view of the acoustic wave element in accordance with the third embodiment.

FIG. 16A is a cross-sectional view of an acoustic wave device in accordance with a third embodiment, and FIG. 16B is a cross-sectional view of an acoustic wave element in accordance with the third embodiment. FIG. 16B illustrates an acoustic wave element 16a, as an example, but the same applies to an acoustic wave element 26a. As illustrated in FIG. 16A, in an acoustic wave device 300 of the third embodiment, the acoustic wave elements 16a are disposed on the upper surface 13 of a substrate 10a, and the acoustic wave elements 26a are disposed on the lower surface 24 of a substrate 20a. The substrates 10a and 20a are insulating substrates such as, for example, silicon oxide substrates. As illustrated in FIG. 16B, the acoustic wave element 16a is a piezoelectric thin film resonator where a lower electrode 35, a piezoelectric film 36, and an upper electrode 37 are provided on the substrate 10a, and the lower electrode 35 and the upper electrode 37 sandwich the piezoelectric film 36 therebetween. An air gap 38 is formed between the lower electrode 35 and the substrate 10a. The region where the lower electrode 35 and the upper electrode 37 sandwich the piezoelectric film 36 therebetween is the resonance region, and the lower electrode 35 and the upper electrode 37 excite an acoustic wave in the thickness extension mode within the piezoelectric film 36 in the resonance region. The lower electrode 35 and the upper electrode 37 are, for example, metal films made of, for example, ruthenium. The piezoelectric film 36 is, for example, an aluminum nitride film. Other configurations are the same as those of the first embodiment, and the description thereof is thus omitted.

The first and second embodiments describe a case where the acoustic wave elements 16 and 26 are surface acoustic wave resonators, as an example, but the acoustic wave elements 16a and 26a may be piezoelectric thin film resonators as in the third embodiment. Alternatively, one of the acoustic wave elements disposed on the two substrates may be a surface acoustic wave resonator, and the other may be a piezoelectric thin film resonator.

The first to third embodiments describe a case where the acoustic wave elements 16 or 16a disposed on the substrate 10 or 10a form the transmit filter 19 and the acoustic wave elements 26 or 26a disposed on the substrate 20 or 20a form the receive filter 29, but does not intend to suggest any limitation. For example, the acoustic wave elements 16 or 16a may form the receive filter and the acoustic wave elements 26 or 26a may form the transmit filter. Alternatively, the acoustic wave elements 16 or 16a may form one of two transmit filters having different passbands, and the acoustic wave elements 26 or 26a may form the other of the two transmit filters where one of the two transmit filters is for a first band, the other of the two transmit filters is for a second band different from the first band, and a signal of the first band and a signal of the second band are transmitted simultaneously. Alternatively, the acoustic wave elements 16 or 16a may form one of two receive filters having different passbands, and the acoustic wave elements 26 or 26a may form the other of the two receive filters where one of the two receive filters is for a first band, the other of the two receive filters is for a second band different from the first band, and a signal of the first band and a signal of the second band are received simultaneously. Alternatively, the transmit filter 19 and the receive filter 29 may form a multiplexer.

Fourth Embodiment

Figure 17:
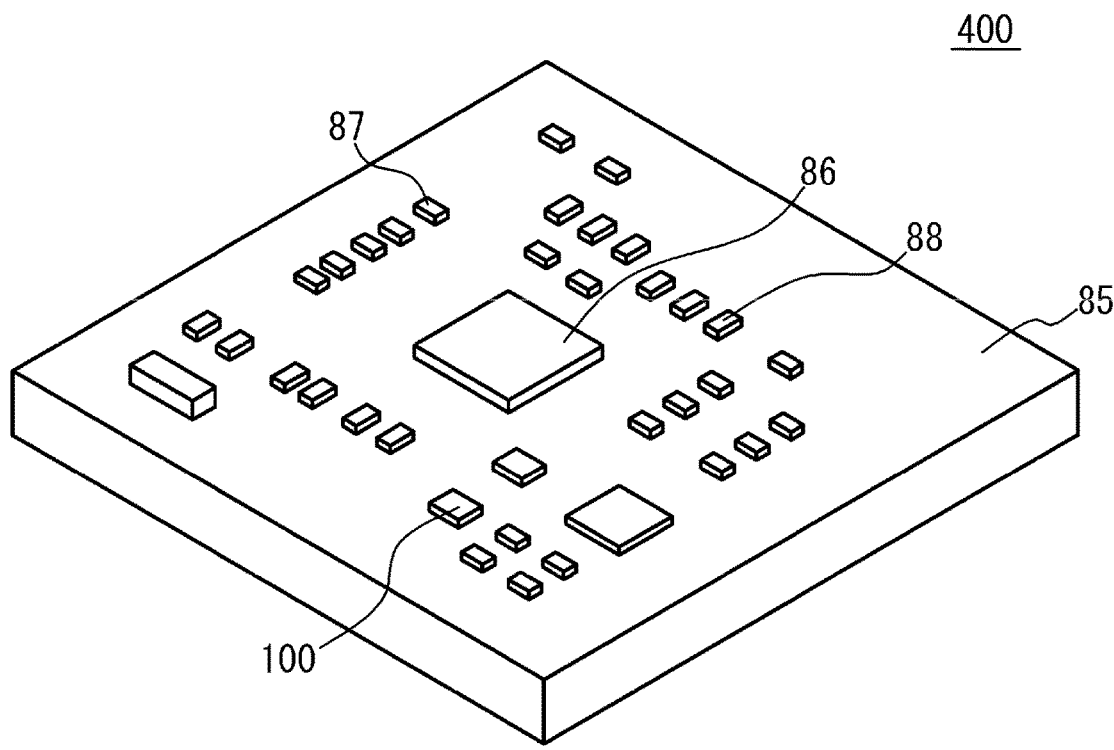
FIG. 17 is a perspective view of a communication module in accordance with a fourth embodiment.

FIG. 17 is a perspective view of a communication module in accordance with a fourth embodiment. As illustrated in FIG. 17, in a communication module 400 of the fourth embodiment, one or more integrated circuits (ICs) 86, one or more chip inductors 87, one or more chip capacitors 88, and one or more acoustic wave devices 100 of the first embodiment are mounted on a circuit substrate 85. Since the covering metal layer 75 is provided on the surface of the acoustic wave device 100, the electromagnetic field coupling between the acoustic wave device 100 and another device mounted on the circuit substrate 85 is inhibited. That is, the influence of the electromagnetic field on the external device from the acoustic wave device 100 can be reduced, and the influence of the electromagnetic field on the acoustic wave device 100 from the external device can be reduced. The fourth embodiment describes a case where the acoustic wave device 100 of the first embodiment is mounted, but the acoustic wave device of any one of the first to third variations of the first embodiment and the second and third embodiments may be mounted.

Although the embodiments of the present invention have been described in detail, the present invention is not limited to such a specific embodiment, and it is to be understood that the various change, substitutions, and alterations could be made hereto without departing from the spirit and scope of the invention.

What is claimed is:

1. An acoustic wave device comprising:
   a first substrate having a first surface, a second surface opposite from the first surface, and side surfaces connecting the first surface and the second surface;
   a first acoustic wave element disposed on the first surface of the first substrate;
   a second substrate that is provided over the first surface of the first substrate and over the first acoustic wave element and has a first air gap between the second substrate and the first substrate;
   a second acoustic wave element disposed on the second substrate;
   a ground terminal disposed on the second surface of the first substrate;
   a first metal layer provided between the first acoustic wave element and the second acoustic wave element and located in the first air gap; and
   a second metal layer that covers half or more of a total area of the side surfaces of the first substrate and electrically connects the first metal layer and the ground terminal; and
   a terminal that is electrically connected to the second acoustic wave element, insulated from the second metal layer, and provided on the second surface of the first substrate.

2. The acoustic wave device according to claim 1, wherein the second metal layer covers the side surfaces from first ends, which are at a side of the first surface, of the side surfaces of the first substrate to second ends, which are at a side of the second surface, of the side surfaces of the first substrate.

3. The acoustic wave device according to claim 1, wherein the second metal layer is provided on each of the side surfaces of the first substrate, and covers at least a part of each of the side surfaces.

4. The acoustic wave device according to claim 1, wherein the second metal layer covers 90% or more of the total area of the side surfaces of the first substrate.

5. The acoustic wave device according to claim 1, further comprising:
- a ring-shaped metal layer that is provided on the first surface of the first substrate, surrounds the first acoustic wave element, seals the first acoustic wave element in the first air gap between the first substrate and the second substrate, and is electrically connected to the first metal layer,
- wherein the second metal layer is in contact with at least a part of a surface of the ring-shaped metal layer from the side surfaces of the first substrate.

6. The acoustic wave device according to claim 5,
- wherein the second substrate includes a third surface opposite to the first substrate, a fourth surface opposite from the third surface, and side surfaces connecting the third surface and the fourth surface,
- wherein the second acoustic wave element is disposed on the third surface, and is sealed in the first air gap together with the first acoustic wave element by the ring-shaped metal layer,
- wherein the second metal layer covers surfaces extending from the side surfaces of the first substrate to the side surfaces of the second substrate and the fourth surface through the surface of the ring-shaped metal layer.

7. The acoustic wave device according to claim 5, further comprising:
- a sealing portion provided over a third surface opposite from a fourth surface of the second substrate, the fourth surface being opposite to the first surface of the first substrate,
- wherein the second acoustic wave element is disposed on the third surface, and is sealed in a second air gap between the second substrate and the sealing portion by the sealing portion, the second air gap being different from the first air gap,
- wherein the second metal layer covers surfaces extending from the side surfaces of the first substrate to side surfaces, which connect the third surface and the fourth surface, of the second substrate and a surface of the sealing portion through the surface of the ring-shaped metal layer.

8. The acoustic wave device according to claim 1, further comprising: a via wiring penetrating through the first substrate from the first surface to the second surface, and electrically connecting a wiring electrically connected to the first acoustic wave element and the ground terminal.

9. The acoustic wave device according to claim 1,
- wherein the first acoustic wave element is provided in plural on the first substrate, and the first acoustic wave elements form a first acoustic wave filter,
- wherein the second acoustic wave element is provided in plural on the second substrate, and the second acoustic wave elements form a second acoustic wave filter having a passband different from a passband of the first acoustic wave filter, and
- wherein the first acoustic wave filter and the second acoustic wave filter form a multiplexer.

10. A communication module comprising:
a circuit substrate; and
the acoustic wave device according to claim 1 mounted on the circuit substrate.

11. The acoustic wave device according to claim 1,
- wherein the second acoustic wave element is electrically connected to the terminal through a wiring electrically connected to the second acoustic wave element, a pillar provided between the first substrate and the second substrate and penetrating through the first metal layer, and a via wiring provided in the first substrate.

12. The acoustic wave device according to claim 1,
- wherein the second metal layer is provided on two opposing side surfaces of the side surfaces of the first substrate.

* * * * *